(12) United States Patent
Kolamkar et al.

(10) Patent No.: US 12,392,833 B2
(45) Date of Patent: Aug. 19, 2025

(54) ELECTRONIC BATTERY TESTER

(71) Applicant: Midtronics, Inc., Willowbrook, IL (US)

(72) Inventors: Maithili Dinanath Kolamkar, Glen Ellyn, IL (US); Lance Losinski, Crown Point, IN (US); Paul George Lacroix, IV, Chicago, IL (US); Anh Hoang Duy Pham, Chicago, IL (US)

(73) Assignee: Midtronics, Inc., Willowbrook, IL (US)

( * ) Notice: Subject to any disclaimer, the term of this patent is extended or adjusted under 35 U.S.C. 154(b) by 162 days.

(21) Appl. No.: 18/314,266

(22) Filed: May 9, 2023

(65) Prior Publication Data

US 2023/0358818 A1 Nov. 9, 2023

Related U.S. Application Data

(60) Provisional application No. 63/339,618, filed on May 9, 2022.

(51) Int. Cl.
*G01R 31/3835* (2019.01)

(52) U.S. Cl.
CPC ............... *G01R 31/3835* (2019.01)

(58) Field of Classification Search
CPC ................................ G01R 31/3835
See application file for complete search history.

(56) References Cited

U.S. PATENT DOCUMENTS

| 85,553 A | 1/1869 | Adams | 33/472 |
| 2,000,665 A | 5/1935 | Neal | 439/440 |
| 2,254,846 A | 9/1941 | Heyer | 324/437 |
| 2,417,940 A | 3/1947 | Lehman | 200/61.25 |
| 2,437,772 A | 3/1948 | Wall | 324/523 |

(Continued)

FOREIGN PATENT DOCUMENTS

| CN | 2470964 Y | 1/2002 |
| CN | 201063352 Y | 5/2008 |

(Continued)

OTHER PUBLICATIONS

U.S. Appl. No. 18/616,458, filed Mar. 26, 2024.

(Continued)

*Primary Examiner* — Minh Q Phan
(74) *Attorney, Agent, or Firm* — Westman, Champlin & Koehler, P.A.

(57) ABSTRACT

An electronic battery tester for testing a storage battery in an automotive vehicle includes first test circuitry configured to couple to the storage battery, apply a forcing function to the storage battery, measure a response of the storage battery to the applied forcing function and provide a battery test output related to a condition of the battery based upon the response of the battery to the applied forcing function. Starter voltage measurement circuitry electrically couples to a starter motor of the automotive vehicle and collects starter voltage profile information comprising a plurality of starter voltage measurements obtained at different times while operating the starter motor. Second test circuitry receives the battery test output from the first test circuitry and the starter voltage profile information and provides an enhanced battery test output related to the condition of the battery based upon the battery test output and the starter voltage profile information.

22 Claims, 8 Drawing Sheets

(56) References Cited

U.S. PATENT DOCUMENTS

| | | | |
|---|---|---|---|
| 2,514,745 A | 7/1950 | Dalzell | 324/115 |
| 2,689,939 A | 9/1954 | Godshalk | |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,704,439 A | 11/1972 | Nelson | |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,401 A | 4/1974 | Wright et al. | |
| 3,808,522 A | 4/1974 | Sharaf | 324/430 |
| 3,808,573 A | 4/1974 | Cappell | |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,879,654 A | 4/1975 | Kessinger | 324/434 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,939,400 A | 2/1976 | Steele | 324/434 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,045,718 A | 8/1977 | Gray | |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/774 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,176,315 A | 11/1979 | Sunnarborg | 324/133 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,295,468 A | 10/1981 | Bartelt | |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,484,140 A | 11/1984 | Dieu | |
| 4,502,000 A | 2/1985 | Mashikian | |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,544,312 A | 10/1985 | Stencel | |
| 4,560,230 A | 12/1985 | Inglis | 439/890 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,643,511 A | 2/1987 | Gawlik | 439/755 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,826,457 A | 5/1989 | Varatta | 439/504 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |

(56) References Cited

U.S. PATENT DOCUMENTS

| | | | |
|---|---|---|---|
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,335 A | 8/1991 | Campbell | 439/217 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,083,076 A | 1/1992 | Scott | 320/105 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,167,529 A | 12/1992 | Verge | 427/1 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | 307/10.1 |
| 5,194,799 A | 3/1993 | Tomantschger | 320/103 |
| 5,202,617 A | 4/1993 | Nor | |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,296,823 A | 3/1994 | Dietrich | 333/161 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A | 5/1994 | Kim | 174/350 |
| 5,313,152 A | 5/1994 | Wozniak et al. | 320/118 |
| 5,315,287 A | 5/1994 | Sol | 340/455 |
| 5,321,231 A | 6/1994 | Schmalzriedt et al. | |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/128 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/106 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 429/65 |
| 5,432,426 A | 7/1995 | Yoshida | 320/160 |
| 5,432,429 A | 7/1995 | Armstrong, II et al. | |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A | 10/1995 | Keith | 180/279 |
| 5,469,043 A | 11/1995 | Cherng et al. | 320/161 |
| 5,485,090 A | 1/1996 | Stephens | 324/433 |
| 5,486,123 A | 1/1996 | Miyazaki | 439/825 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,555,498 A | 9/1996 | Berra | |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,292 A | 12/1996 | Rozon | |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |

(56) References Cited

U.S. PATENT DOCUMENTS

| | | | |
|---|---|---|---|
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 320/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,826,467 A | 10/1998 | Huang | |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,870,018 A | 2/1999 | Person | 307/10.2 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/433 |
| 5,883,306 A | 3/1999 | Hwang | 73/146.8 |
| 5,884,202 A | 3/1999 | Arjomand | 701/31.4 |
| 5,894,222 A | 4/1999 | Hibino | |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/334 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,009,742 A | 1/2000 | Balko | |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,076,018 A | 6/2000 | Sturman et al. | |
| 6,081,098 A | 6/2000 | Bertness et al. | 320/134 |
| 6,081,109 A | 6/2000 | Seymour et al. | 324/127 |
| 6,081,154 A | 6/2000 | Ezell et al. | 327/540 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,030 A | 7/2000 | Gimthorpe et al. | |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,118,252 A | 9/2000 | Richter | |
| 6,121,880 A | 9/2000 | Scott et al. | 340/572.5 |
| 6,130,519 A | 10/2000 | Whiting et al. | |
| 6,136,914 A | 10/2000 | Hergenrother et al. | 524/495 |
| 6,137,261 A | 10/2000 | Kurle et al. | |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,149,653 A | 11/2000 | Deslauriers | 606/232 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,177,878 B1 | 1/2001 | Tamura | |
| 6,181,545 B1 | 1/2001 | Amatucci et al. | 361/502 |
| 6,184,655 B1 | 2/2001 | Malackowski | 320/116 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,242,921 B1 | 6/2001 | Thibedeau et al. | 324/429 |
| 6,249,124 B1 | 6/2001 | Bertness | 324/426 |
| 6,250,973 B1 | 6/2001 | Lowery et al. | 439/763 |

(56) References Cited

U.S. PATENT DOCUMENTS

| | | | |
|---|---|---|---|
| 6,252,942 B1 | 6/2001 | Zoiss | 379/19 |
| 6,254,438 B1 | 7/2001 | Gaunt | 439/755 |
| 6,255,826 B1 | 7/2001 | Ohsawa | 320/116 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,385 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,426,606 B1 | 7/2002 | Purkey | |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,501,243 B1 | 12/2002 | Kaneko | 318/139 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,847 B1 | 3/2003 | Tsukamoto et al. | |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,573,685 B2 | 6/2003 | Nakanishi et al. | |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B2 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,895,809 B2 | 5/2005 | Raichle | 73/119 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,911,825 B2 | 6/2005 | Namaky | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,957,133 B1 | 10/2005 | Hunt et al. | 701/32.4 |
| 6,961,445 B1 | 11/2005 | Jensen et al. | |
| 6,967,484 B2 | 11/2005 | Bertness | 324/426 |
| 6,972,662 B1 | 12/2005 | Ohkawa et al. | 340/10.1 |

(56) References Cited

U.S. PATENT DOCUMENTS

| | | | |
|---|---|---|---|
| 6,983,212 B2 | 1/2006 | Burns | 702/63 |
| 6,988,053 B2 | 1/2006 | Namaky | 320/104 |
| 6,993,421 B2 | 1/2006 | Pillar et al. | 701/29.4 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,049,822 B2 | 5/2006 | Kung | 324/426 |
| 7,058,525 B2 | 6/2006 | Bertness et al. | 702/63 |
| 7,069,979 B2 | 7/2006 | Tobias | 165/104.33 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,173,182 B2 | 2/2007 | Katsuyama | 174/36 |
| 7,177,925 B2 | 2/2007 | Carcido et al. | 709/223 |
| 7,182,147 B2 | 2/2007 | Cutler et al. | 173/1 |
| 7,184,866 B2 | 2/2007 | Squires | 340/426.15 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al. | 700/276 |
| 7,212,911 B2 | 5/2007 | Raichle et al. | 701/114 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,251,551 B2 | 7/2007 | Mitsueda | 700/2 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,301,303 B1 | 11/2007 | Hulden | 320/103 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,376,497 B2 | 5/2008 | Chen | 701/31.6 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,504,830 B2 | 3/2009 | Keuss | |
| 7,505,856 B2 | 3/2009 | Restaino et al. | 702/63 |
| 7,538,571 B2 | 5/2009 | Raichle et al. | 324/772 |
| 7,545,146 B2 | 6/2009 | Klang et al. | 324/426 |
| 7,557,586 B1 | 7/2009 | Vonderhaar et al. | 324/437 |
| 7,571,035 B2 | 8/2009 | Raichle | |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,596,437 B1 | 9/2009 | Hunt et al. | |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 320/116 |
| 7,684,908 B1 | 3/2010 | Ogilvie et al. | 701/29.6 |
| 7,688,074 B2 | 3/2010 | Cox et al. | 324/426 |
| 7,690,573 B2 | 4/2010 | Raichle et al. | 235/462 |
| 7,696,759 B2 | 4/2010 | Raichle et al. | 324/538 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,706,992 B2 | 4/2010 | Ricci et al. | |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,729,880 B1 | 6/2010 | Mashburn | 702/151 |
| 7,743,788 B2 | 6/2010 | Schmitt | 137/554 |
| 7,751,953 B2 | 7/2010 | Namaky | 701/33.2 |
| 7,772,850 B2 | 8/2010 | Bertness | 324/426 |
| 7,774,130 B2 | 8/2010 | Pepper | 340/439 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,797,995 B2 | 9/2010 | Schaefer | |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,914,350 B1 | 3/2011 | Bozich | 439/506 |
| 7,924,015 B2 | 4/2011 | Bertness | 324/427 |
| 7,940,052 B2 | 5/2011 | Vonderhaar | |
| 7,940,053 B2 | 5/2011 | Brown et al. | 324/426 |
| 7,959,476 B2 | 6/2011 | Smith et al. | |
| 7,977,914 B2 | 7/2011 | Bertness | |
| D643,759 S | 8/2011 | Bertness | |
| 7,990,155 B2 | 8/2011 | Henningson | 324/429 |
| 7,999,505 B2 | 8/2011 | Bertness | 320/104 |
| 8,024,083 B2 | 9/2011 | Chenn | 701/2 |
| 8,047,868 B1 | 11/2011 | Korcynski | 439/522 |
| 8,164,343 B2 | 4/2012 | Bertness | 324/503 |
| 8,198,900 B2 | 6/2012 | Bertness et al. | |
| 8,203,345 B2 | 6/2012 | Bertness | |
| 8,222,868 B2 | 7/2012 | Buckner | 320/136 |
| 8,226,008 B2 | 7/2012 | Raichle et al. | 235/462.13 |
| 8,237,448 B2 | 8/2012 | Bertness | |
| 8,306,690 B2 | 11/2012 | Bertness | 701/34.4 |
| 8,310,271 B2 | 11/2012 | Raichle et al. | 324/765.01 |
| 8,344,685 B2 | 1/2013 | Bertness et al. | |
| 8,436,619 B2 | 5/2013 | Bertness et al. | |
| 8,442,877 B2 | 5/2013 | Bertness et al. | |
| 8,449,560 B2 | 5/2013 | Roth | 227/175.1 |
| 8,493,022 B2 | 7/2013 | Bertness | |
| D687,727 S | 8/2013 | Kehoe et al. | |
| 8,509,212 B2 | 8/2013 | Sanjeev | |
| 8,513,949 B2 | 8/2013 | Bertness | |
| 8,594,957 B2 | 11/2013 | Gauthier | 324/548 |
| 8,674,654 B2 | 3/2014 | Bertness | |
| 8,674,711 B2 | 3/2014 | Bertness | |
| 8,704,483 B2 | 4/2014 | Bertness et al. | |
| 8,738,309 B2 | 5/2014 | Bertness | |
| 8,754,653 B2 | 6/2014 | Volderhaar et al. | |
| 8,810,200 B2 | 8/2014 | Kondo | |
| 8,825,272 B1 | 9/2014 | Chinnadurai | |
| 8,827,729 B2 | 9/2014 | Gunreben | 439/188 |
| 8,872,516 B2 | 10/2014 | Bertness | |
| 8,872,517 B2 | 10/2014 | Philbrook et al. | |
| 8,901,888 B1 | 12/2014 | Beckman | |
| 8,958,998 B2 | 2/2015 | Bertness | |
| 8,963,550 B2 | 2/2015 | Bertness et al. | |
| 9,018,958 B2 | 4/2015 | Bertness | |
| 9,037,394 B2 | 5/2015 | Fernandes | 701/400 |
| 9,052,366 B2 | 6/2015 | Bertness | |
| 9,056,556 B1 | 6/2015 | Hyde et al. | |
| 9,166,261 B2 | 10/2015 | Ibi | |
| 9,201,120 B2 | 12/2015 | Stukenburg | |
| 9,229,062 B2 | 1/2016 | Stukenberg | |

(56) References Cited

U.S. PATENT DOCUMENTS

| | | |
|---|---|---|
| 9,244,100 B2 | 1/2016 | Coleman et al. |
| 9,255,955 B2 | 2/2016 | Bertness ................. 324/503 |
| 9,274,157 B2 | 3/2016 | Bertness |
| 9,312,575 B2 | 4/2016 | Stukenberg |
| 9,335,362 B2 | 5/2016 | Bertness |
| 9,419,311 B2 | 8/2016 | Bertness |
| 9,425,487 B2 | 8/2016 | Bertness |
| 9,496,720 B2 | 11/2016 | McShane |
| 9,588,185 B2 | 3/2017 | Champlin |
| 9,639,899 B1 | 5/2017 | Gersitz |
| 9,923,289 B2 | 3/2018 | Bertness |
| 9,966,676 B2 | 5/2018 | Salo, III et al. |
| 10,046,649 B2 | 8/2018 | Bertness |
| 10,222,397 B2 | 3/2019 | Salo et al. |
| 10,317,468 B2 | 6/2019 | Bertness |
| 10,429,449 B2 | 10/2019 | Arnoldus |
| 10,473,555 B2 | 11/2019 | Bertness |
| 10,525,841 B2 | 1/2020 | Zhou et al. |
| 10,608,353 B2 | 3/2020 | Lipkin et al. |
| 10,843,574 B2 | 11/2020 | Palmisano et al. |
| 11,054,480 B2 | 7/2021 | Bertness |
| 11,325,479 B2 | 5/2022 | Bertness |
| 11,474,153 B2 | 10/2022 | Salo, III et al. |
| 11,486,930 B2 | 11/2022 | Salo, III et al. |
| 11,513,160 B2 | 11/2022 | Salo, III et al. |
| 11,545,839 B2 | 1/2023 | Sampson et al. |
| 11,548,404 B2 | 1/2023 | Bertness |
| 11,566,972 B2 | 1/2023 | Sampson et al. |
| 11,650,259 B2 | 5/2023 | Bertness |
| 11,668,779 B2 | 6/2023 | Bertness |
| 11,740,294 B2 | 8/2023 | Bertness |
| 11,745,593 B1 | 9/2023 | Awad Alla |
| 11,926,224 B2 | 3/2024 | Bertness |
| 11,973,202 B2 | 4/2024 | Bertness |
| 12,196,813 B2 | 1/2025 | Bertness |
| 12,237,482 B2 | 2/2025 | Bertness |
| 2001/0012738 A1 | 8/2001 | Duperret ................. 439/835 |
| 2001/0033169 A1 | 10/2001 | Singh ................. 324/426 |
| 2001/0035737 A1 | 11/2001 | Nakanishi et al. ............ 320/122 |
| 2001/0048215 A1 | 12/2001 | Breed et al. ................. 280/728.1 |
| 2001/0048226 A1 | 12/2001 | Nada ................. 290/40 |
| 2002/0003423 A1 | 1/2002 | Bertness et al. ................. 324/426 |
| 2002/0004694 A1 | 1/2002 | McLeod ................. 701/29 |
| 2002/0007237 A1 | 1/2002 | Phung et al. ................. 701/33 |
| 2002/0010558 A1 | 1/2002 | Bertness et al. ................. 702/63 |
| 2002/0018927 A1 | 2/2002 | Thomsen et al. |
| 2002/0021135 A1 | 2/2002 | Li et al. ................. 324/677 |
| 2002/0027346 A1 | 3/2002 | Breed et al. ................. 280/735 |
| 2002/0030495 A1 | 3/2002 | Kechmire ................. 324/427 |
| 2002/0036504 A1 | 3/2002 | Troy et al. ................. 324/430 |
| 2002/0041175 A1 | 4/2002 | Lauper et al. ................. 320/106 |
| 2002/0044050 A1 | 4/2002 | Derbyshire et al. ................. 340/442 |
| 2002/0047711 A1 | 4/2002 | Bertness et al. ................. 324/426 |
| 2002/0050163 A1 | 5/2002 | Makhija et al. ................. 73/116 |
| 2002/0065619 A1 | 5/2002 | Bertness ................. 702/63 |
| 2002/0074398 A1 | 6/2002 | Lancos et al. ................. 235/382 |
| 2002/0116140 A1 | 8/2002 | Rider ................. 702/63 |
| 2002/0118111 A1 | 8/2002 | Brown et al. ................. 340/573.1 |
| 2002/0121877 A1 | 9/2002 | Smith et al. |
| 2002/0121901 A1 | 9/2002 | Hoffman ................. 324/426 |
| 2002/0128985 A1 | 9/2002 | Greenwald ................. 705/400 |
| 2002/0130665 A1 | 9/2002 | Bertness et al. ................. 324/426 |
| 2002/0152791 A1 | 10/2002 | Cardinale |
| 2002/0153864 A1 | 10/2002 | Bertness ................. 320/132 |
| 2002/0171428 A1 | 11/2002 | Bertness ................. 702/63 |
| 2002/0176010 A1 | 11/2002 | Wallach et al. |
| 2002/0193955 A1 | 12/2002 | Bertness ................. 702/63 |
| 2003/0006779 A1 | 1/2003 | H. Youval ................. 324/503 |
| 2003/0009270 A1 | 1/2003 | Breed ................. 701/29 |
| 2003/0017753 A1 | 1/2003 | Palmisano et al. ................. 439/762 |
| 2003/0025481 A1 | 2/2003 | Bertness ................. 324/427 |
| 2003/0030442 A1 | 2/2003 | Sugimoto ................. 324/429 |
| 2003/0036909 A1 | 2/2003 | Kato ................. 704/275 |
| 2003/0038637 A1 | 2/2003 | Bertness et al. |
| 2003/0040873 A1 | 2/2003 | Lesesky et al. ................. 702/57 |
| 2003/0060953 A1 | 3/2003 | Chen ................. 701/33 |
| 2003/0078743 A1 | 4/2003 | Bertness et al. ................. 702/63 |
| 2003/0088375 A1 | 5/2003 | Bertness et al. ................. 702/63 |
| 2003/0090272 A1 | 5/2003 | Bertness ................. 324/426 |
| 2003/0114206 A1 | 6/2003 | Timothy ................. 455/575.7 |
| 2003/0124417 A1 | 7/2003 | Bertness et al. ................. 429/90 |
| 2003/0128011 A1 | 7/2003 | Bertness et al. |
| 2003/0128036 A1 | 7/2003 | Henningson et al. ......... 324/426 |
| 2003/0137277 A1 | 7/2003 | Mori et al. ................. 320/132 |
| 2003/0155930 A1 | 8/2003 | Thomsen |
| 2003/0164073 A1 | 9/2003 | Chen |
| 2003/0169018 A1 | 9/2003 | Berels et al. ................. 320/132 |
| 2003/0169019 A1 | 9/2003 | Oosaki ................. 320/132 |
| 2003/0171111 A1 | 9/2003 | Clark ................. 455/414.1 |
| 2003/0173971 A1 | 9/2003 | Bertness ................. 324/441 |
| 2003/0177417 A1 | 9/2003 | Malhotra et al. ................. 714/42 |
| 2003/0184262 A1 | 10/2003 | Makhija ................. 320/156 |
| 2003/0184264 A1 | 10/2003 | Bertness |
| 2003/0184306 A1 | 10/2003 | Bertness et al. ............... 324/426 |
| 2003/0187556 A1 | 10/2003 | Suzuki ................. 701/29 |
| 2003/0194672 A1 | 10/2003 | Roberts et al. ................. 431/196 |
| 2003/0197512 A1 | 10/2003 | Miller et al. ................. 324/426 |
| 2003/0212311 A1 | 11/2003 | Nova et al. ................. 600/300 |
| 2003/0214395 A1 | 11/2003 | Flowerday et al. .......... 340/445 |
| 2003/0224241 A1 | 12/2003 | Takada et al. ................. 429/52 |
| 2003/0236656 A1 | 12/2003 | Dougherty ................. 703/14 |
| 2004/0000590 A1 | 1/2004 | Raichle et al. ........... 235/462.01 |
| 2004/0000891 A1 | 1/2004 | Raichle et al. ................. 320/107 |
| 2004/0000893 A1 | 1/2004 | Raichle et al. ................. 320/135 |
| 2004/0000913 A1 | 1/2004 | Raichle et al. ................. 324/426 |
| 2004/0000915 A1 | 1/2004 | Raichle et al. ................. 324/522 |
| 2004/0002824 A1 | 1/2004 | Raichle et al. ................. 702/63 |
| 2004/0002825 A1 | 1/2004 | Raichle et al. ................. 702/63 |
| 2004/0002836 A1 | 1/2004 | Raichle et al. ................. 702/188 |
| 2004/0032264 A1 | 2/2004 | Schoch ................. 324/426 |
| 2004/0036443 A1 | 2/2004 | Bertness ................. 320/109 |
| 2004/0044452 A1 | 3/2004 | Bauer et al. ................. 703/33 |
| 2004/0044454 A1 | 3/2004 | Ross et al. ................. 701/33 |
| 2004/0046564 A1 | 3/2004 | Klang ................. 324/426 |
| 2004/0049361 A1 | 3/2004 | Hamdan et al. ................. 702/115 |
| 2004/0051532 A1 | 3/2004 | Smith et al. ................. 324/426 |
| 2004/0051533 A1 | 3/2004 | Namaky ................. 324/426 |
| 2004/0051534 A1 | 3/2004 | Kobayashi et al. .......... 324/429 |
| 2004/0054503 A1 | 3/2004 | Namaky ................. 702/182 |
| 2004/0064225 A1 | 4/2004 | Jammu et al. ................. 701/29 |
| 2004/0065489 A1 | 4/2004 | Aberle ................. 180/65.1 |
| 2004/0088087 A1 | 5/2004 | Fukushima et al. ............ 701/32 |
| 2004/0090208 A1 | 5/2004 | Almerich |
| 2004/0104728 A1 | 6/2004 | Bertness et al. ................. 324/429 |
| 2004/0108855 A1 | 6/2004 | Raichle ................. 324/378 |
| 2004/0108856 A1 | 6/2004 | Johnson ................. 324/426 |
| 2004/0113494 A1 | 6/2004 | Karuppana et al. |
| 2004/0113588 A1 | 6/2004 | Mikuriya et al. ................. 320/128 |
| 2004/0145342 A1 | 7/2004 | Lyon ................. 320/108 |
| 2004/0145371 A1 | 7/2004 | Bertness ................. 324/426 |
| 2004/0150494 A1 | 8/2004 | Yoshida ................. 333/243 |
| 2004/0157113 A1 | 8/2004 | Klang ................. 429/50 |
| 2004/0164706 A1 | 8/2004 | Osborne ................. 320/116 |
| 2004/0172177 A1 | 9/2004 | Nagai et al. ................. 701/29 |
| 2004/0178185 A1 | 9/2004 | Yoshikawa et al. .......... 219/270 |
| 2004/0189309 A1 | 9/2004 | Bertness et al. ................. 324/426 |
| 2004/0199343 A1 | 10/2004 | Cardinal et al. ................. 702/63 |
| 2004/0207367 A1 | 10/2004 | Taniguchi et al. ................. 320/149 |
| 2004/0212350 A1 | 10/2004 | Patino et al. |
| 2004/0221641 A1 | 11/2004 | Moritsugu ................. 73/23.31 |
| 2004/0227523 A1 | 11/2004 | Namaky ................. 324/537 |
| 2004/0239332 A1 | 12/2004 | Mackel et al. ................. 324/426 |
| 2004/0251876 A1 | 12/2004 | Bertness et al. ................. 320/136 |
| 2004/0251907 A1 | 12/2004 | Kalley |
| 2004/0257084 A1 | 12/2004 | Restaino ................. 324/400 |
| 2005/0007068 A1 | 1/2005 | Johnson et al. ................. 320/110 |
| 2005/0009122 A1 | 1/2005 | Whelan et al. ................. 435/7.32 |
| 2005/0017726 A1 | 1/2005 | Koran et al. ................. 324/433 |
| 2005/0017952 A1 | 1/2005 | His ................. 345/169 |
| 2005/0021197 A1 | 1/2005 | Zimmerman ................. 701/31.4 |
| 2005/0021294 A1 | 1/2005 | Trsar et al. ................. 702/183 |
| 2005/0021475 A1 | 1/2005 | Bertness ................. 705/63 |
| 2005/0025299 A1 | 2/2005 | Tischer et al. ................. 379/199 |
| 2005/0035752 A1 | 2/2005 | Bertness |

(56) References Cited

U.S. PATENT DOCUMENTS

| | | | |
|---|---|---|---|
| 2005/0043868 A1 | 2/2005 | Mitcham | 701/29 |
| 2005/0057256 A1 | 3/2005 | Bertness | 324/426 |
| 2005/0060070 A1 | 3/2005 | Kapolka et al. | 701/29 |
| 2005/0073314 A1 | 4/2005 | Bertness et al. | 324/433 |
| 2005/0076381 A1 | 4/2005 | Gross | 725/107 |
| 2005/0077904 A1 | 4/2005 | Bertness | 324/426 |
| 2005/0096809 A1 | 5/2005 | Skeen et al. | 701/29 |
| 2005/0099185 A1 | 5/2005 | Klang | |
| 2005/0102073 A1 | 5/2005 | Ingram | 701/29 |
| 2005/0119809 A1 | 6/2005 | Chen | 701/33.5 |
| 2005/0128083 A1 | 6/2005 | Puzio et al. | 340/572.1 |
| 2005/0128902 A1 | 6/2005 | Tsai | 369/44.32 |
| 2005/0133245 A1 | 6/2005 | Katsuyama | 174/74 R |
| 2005/0134282 A1 | 6/2005 | Averbuch | 324/426 |
| 2005/0143882 A1 | 6/2005 | Umezawa | 701/29 |
| 2005/0159847 A1 | 7/2005 | Shah et al. | 700/276 |
| 2005/0162172 A1 | 7/2005 | Bertness | 324/426 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0184732 A1 | 8/2005 | Restaino | 324/426 |
| 2005/0192045 A1 | 9/2005 | Lowles | |
| 2005/0206346 A1 | 9/2005 | Smith et al. | |
| 2005/0212521 A1 | 9/2005 | Bertness et al. | 324/426 |
| 2005/0213874 A1 | 9/2005 | Kline | 385/15 |
| 2005/0214144 A1 | 9/2005 | Yoshida | |
| 2005/0218902 A1 | 10/2005 | Restaino et al. | 324/433 |
| 2005/0231205 A1 | 10/2005 | Bertness et al. | 324/426 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2005/0264296 A1 | 12/2005 | Philbrook | 324/433 |
| 2005/0269880 A1 | 12/2005 | Konishi | 307/10.7 |
| 2005/0273218 A1 | 12/2005 | Breed | 701/2 |
| 2006/0012330 A1 | 1/2006 | Okumura et al. | 320/103 |
| 2006/0017447 A1 | 1/2006 | Bertness | 324/426 |
| 2006/0026017 A1 | 2/2006 | Walkder | 701/31.4 |
| 2006/0030980 A1 | 2/2006 | St. Denis | 701/29 |
| 2006/0038572 A1 | 2/2006 | Philbrook | |
| 2006/0043976 A1 | 3/2006 | Gervais | 324/508 |
| 2006/0061469 A1 | 3/2006 | Jaeger | 340/539.13 |
| 2006/0076923 A1 | 4/2006 | Eaves | 320/112 |
| 2006/0079203 A1 | 4/2006 | Nicolini | 455/411 |
| 2006/0089767 A1 | 4/2006 | Sowa | 701/29 |
| 2006/0090554 A1 | 5/2006 | Krampitz | |
| 2006/0090555 A1 | 5/2006 | Krampitz | |
| 2006/0091597 A1 | 5/2006 | Opsahl | |
| 2006/0092584 A1 | 5/2006 | Raichle | |
| 2006/0095230 A1 | 5/2006 | Grier et al. | 702/183 |
| 2006/0102397 A1 | 5/2006 | Buck | 429/432 |
| 2006/0125482 A1 | 6/2006 | Klang | |
| 2006/0136119 A1 | 6/2006 | Raichle | |
| 2006/0139167 A1 | 6/2006 | Davie | |
| 2006/0152224 A1 | 7/2006 | Kim et al. | 324/430 |
| 2006/0155439 A1 | 7/2006 | Slawinski | 701/33.4 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0244456 A1 | 11/2006 | Henningson | |
| 2006/0244457 A1 | 11/2006 | Henningson et al. | 324/426 |
| 2006/0282227 A1 | 12/2006 | Bertness | |
| 2006/0282323 A1 | 12/2006 | Walker et al. | 705/14 |
| 2007/0005201 A1 | 1/2007 | Chenn | 701/31.5 |
| 2007/0024460 A1 | 2/2007 | Clark | 340/426 |
| 2007/0026916 A1 | 2/2007 | Juds et al. | 463/1 |
| 2007/0046261 A1 | 3/2007 | Porebski | 320/132 |
| 2007/0069734 A1 | 3/2007 | Bertness | |
| 2007/0082652 A1 | 4/2007 | Hartigan | |
| 2007/0088472 A1 | 4/2007 | Ganzhorn et al. | 701/33 |
| 2007/0108942 A1 | 5/2007 | Johnson et al. | 320/112 |
| 2007/0159177 A1 | 7/2007 | Bertness et al. | 324/426 |
| 2007/0182576 A1 | 8/2007 | Proska et al. | 340/636.1 |
| 2007/0194791 A1 | 8/2007 | Huang | 324/430 |
| 2007/0194793 A1 | 8/2007 | Bertness | 324/503 |
| 2007/0205752 A1 | 9/2007 | Leigh | 324/500 |
| 2007/0205983 A1 | 9/2007 | Naimo | 345/160 |
| 2007/0210801 A1 | 9/2007 | Krampitz | 324/426 |
| 2007/0244660 A1 | 10/2007 | Bertness | |
| 2007/0259256 A1 | 11/2007 | Le Canut et al. | 429/90 |
| 2007/0279066 A1 | 12/2007 | Chism | 324/437 |
| 2008/0023547 A1 | 1/2008 | Raichle | 235/462.13 |
| 2008/0036421 A1 | 2/2008 | Seo et al. | 320/132 |
| 2008/0053716 A1 | 3/2008 | Scheucher | 180/2.1 |
| 2008/0059014 A1 | 3/2008 | Nasr et al. | 701/22 |
| 2008/0064559 A1 | 3/2008 | Cawthorne | 477/5 |
| 2008/0086246 A1 | 4/2008 | Bolt et al. | 701/29 |
| 2008/0087479 A1 | 4/2008 | Kang | |
| 2008/0094068 A1 | 4/2008 | Scott | 324/426 |
| 2008/0103656 A1 | 5/2008 | Lipscomb | 701/33.4 |
| 2008/0106267 A1 | 5/2008 | Bertness | 320/112 |
| 2008/0169818 A1 | 7/2008 | Lesesky et al. | 324/426 |
| 2008/0179122 A1 | 7/2008 | Sugawara | 180/65.245 |
| 2008/0194984 A1 | 8/2008 | Keefe | 600/559 |
| 2008/0238357 A1 | 10/2008 | Bourilkov et al. | |
| 2008/0256815 A1 | 10/2008 | Schafer | |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0011327 A1 | 1/2009 | Okumura et al. | 429/99 |
| 2009/0013521 A1 | 1/2009 | Okumura et al. | 29/730 |
| 2009/0024266 A1 | 1/2009 | Bertness | 701/22 |
| 2009/0024419 A1 | 1/2009 | McClellan | 705/4 |
| 2009/0085571 A1 | 4/2009 | Bertness | 324/426 |
| 2009/0146610 A1 | 6/2009 | Trigiani | |
| 2009/0146800 A1 | 6/2009 | Grimlund et al. | 340/505 |
| 2009/0160395 A1 | 6/2009 | Chen | 320/101 |
| 2009/0184165 A1 | 7/2009 | Bertness et al. | |
| 2009/0198372 A1 | 8/2009 | Hammerslag | 700/226 |
| 2009/0203247 A1 | 8/2009 | Fifelski | 439/345 |
| 2009/0237029 A1 | 9/2009 | Andelfinger | 320/108 |
| 2009/0237086 A1 | 9/2009 | Andelfinger | 324/431 |
| 2009/0247020 A1 | 10/2009 | Gathman et al. | 439/759 |
| 2009/0251151 A1 | 10/2009 | Miyashita | |
| 2009/0259432 A1 | 10/2009 | Liberty | 702/150 |
| 2009/0265121 A1 | 10/2009 | Rocci | 702/57 |
| 2009/0273451 A1 | 11/2009 | Soppera et al. | |
| 2009/0276115 A1 | 11/2009 | Chen | 701/32 |
| 2009/0311919 A1 | 12/2009 | Smith | 439/759 |
| 2010/0023198 A1 | 1/2010 | Hamilton | 701/29 |
| 2010/0039065 A1 | 2/2010 | Kinkade | 320/104 |
| 2010/0052193 A1 | 3/2010 | Sylvester | 261/26 |
| 2010/0066283 A1 | 3/2010 | Kitanaka | 318/400.02 |
| 2010/0088050 A1 | 4/2010 | Keuss | 702/63 |
| 2010/0094496 A1 | 4/2010 | Hershkovitz et al. | |
| 2010/0117603 A1 | 5/2010 | Makhija | 320/162 |
| 2010/0145780 A1 | 6/2010 | Nishikawa et al. | 705/14.11 |
| 2010/0214055 A1 | 8/2010 | Fuji | 340/3.1 |
| 2010/0265131 A1 | 10/2010 | Fabius | |
| 2010/0314950 A1 | 12/2010 | Rutkowski et al. | 307/125 |
| 2011/0004427 A1 | 1/2011 | Gorbold et al. | 702/63 |
| 2011/0015815 A1 | 1/2011 | Bertness | 701/22 |
| 2011/0106280 A1 | 5/2011 | Zeier | 700/90 |
| 2011/0127960 A1 | 6/2011 | Plett | |
| 2011/0161025 A1 | 6/2011 | Tomura | 702/63 |
| 2011/0215767 A1 | 9/2011 | Johnson et al. | 320/136 |
| 2011/0218747 A1 | 9/2011 | Bertness | 702/63 |
| 2011/0239445 A1 | 10/2011 | Ibi | |
| 2011/0258112 A1 | 10/2011 | Eder et al. | |
| 2011/0265025 A1 | 10/2011 | Bertness | |
| 2011/0267067 A1 | 11/2011 | Bertness et al. | |
| 2011/0273181 A1 | 11/2011 | Park et al. | 324/429 |
| 2011/0294367 A1 | 12/2011 | Moon | 439/878 |
| 2011/0300416 A1 | 12/2011 | Bertness | |
| 2012/0041697 A1 | 2/2012 | Stukenberg | 702/63 |
| 2012/0046807 A1 | 2/2012 | Ruther | 701/2 |
| 2012/0046824 A1 | 2/2012 | Ruther et al. | 701/31.5 |
| 2012/0062237 A1 | 3/2012 | Robinson | 324/433 |
| 2012/0074904 A1 | 3/2012 | Rutkowski et al. | 320/112 |
| 2012/0086399 A1 | 4/2012 | Choi | |
| 2012/0091962 A1 | 4/2012 | DeFrank et al. | |
| 2012/0116391 A1 | 5/2012 | Houser | 606/41 |
| 2012/0182132 A1 | 7/2012 | McShane | |
| 2012/0249069 A1 | 10/2012 | Ohtomo | 320/109 |

(56) References Cited

U.S. PATENT DOCUMENTS

| | | | |
|---|---|---|---|
| 2012/0256494 A1 | 10/2012 | Kesler | 307/104 |
| 2012/0256568 A1 | 10/2012 | Lee | 318/139 |
| 2012/0274331 A1 | 11/2012 | Liu | 324/426 |
| 2012/0293372 A1 | 11/2012 | Amendolare | 342/451 |
| 2013/0049678 A1 | 2/2013 | Li | |
| 2013/0099747 A1 | 4/2013 | Baba | 310/118 |
| 2013/0106362 A1 | 5/2013 | Mackintosh et al. | |
| 2013/0106596 A1 | 5/2013 | Mouchet | |
| 2013/0115821 A1 | 5/2013 | Golko | 439/638 |
| 2013/0134926 A1 | 5/2013 | Yoshida | |
| 2013/0158782 A1 | 6/2013 | Bertness et al. | 701/34.4 |
| 2013/0172019 A1 | 7/2013 | Youssef | 455/456.6 |
| 2013/0200855 A1 | 8/2013 | Christensen et al. | |
| 2013/0218781 A1 | 8/2013 | Simon | |
| 2013/0288706 A1 | 10/2013 | Yu | 455/456.1 |
| 2013/0297247 A1 | 11/2013 | Jardine | |
| 2013/0311124 A1 | 11/2013 | Van Bremen | 702/104 |
| 2013/0314041 A1 | 11/2013 | Proebstle | 320/109 |
| 2013/0325405 A1 | 12/2013 | Miller | |
| 2014/0002021 A1 | 1/2014 | Bertness | |
| 2014/0002094 A1 | 1/2014 | Champlin | 324/426 |
| 2014/0029308 A1 | 1/2014 | Cojocaru | 363/13 |
| 2014/0081527 A1 | 3/2014 | Miller | |
| 2014/0091762 A1 | 4/2014 | Kondo | |
| 2014/0099830 A1 | 4/2014 | Byrne | 439/638 |
| 2014/0117997 A1 | 5/2014 | Bertness | 324/426 |
| 2014/0132223 A1 | 5/2014 | Kerfoot, Jr | |
| 2014/0145670 A1 | 5/2014 | van Zwam et al. | |
| 2014/0162497 A1 | 6/2014 | Lim | |
| 2014/0194084 A1 | 7/2014 | Noonan | 455/404.1 |
| 2014/0225622 A1 | 8/2014 | Kudo | 324/433 |
| 2014/0239964 A1 | 8/2014 | Gach | 324/433 |
| 2014/0260577 A1 | 9/2014 | Chinnadurai | |
| 2014/0266061 A1 | 9/2014 | Wachal | |
| 2014/0278159 A1 | 9/2014 | Chinnadurai | |
| 2014/0333313 A1 | 11/2014 | Surampudi | |
| 2014/0354237 A1 | 12/2014 | Cotton | |
| 2014/0368156 A1 | 12/2014 | Aloe | |
| 2014/0374475 A1 | 12/2014 | Kallfelz et al. | |
| 2015/0093922 A1 | 4/2015 | Bosscher | 439/39 |
| 2015/0115720 A1 | 4/2015 | Hysell | 307/65 |
| 2015/0166518 A1 | 6/2015 | Boral et al. | |
| 2015/0168499 A1 | 6/2015 | Palmisano | |
| 2015/0221135 A1 | 8/2015 | Hill | 345/633 |
| 2015/0239365 A1 | 8/2015 | Hyde et al. | |
| 2015/0353192 A1 | 12/2015 | Morrison | |
| 2016/0011271 A1 | 1/2016 | Bertness | |
| 2016/0013523 A1 | 1/2016 | Anzicek | |
| 2016/0091571 A1 | 3/2016 | Salo, III | |
| 2016/0154044 A1 | 6/2016 | Bertness | |
| 2016/0171799 A1 | 6/2016 | Bertness | |
| 2016/0216335 A1 | 7/2016 | Bertness | |
| 2016/0226280 A1 | 8/2016 | Noor et al. | |
| 2016/0232736 A1 | 8/2016 | Holtappels | |
| 2016/0238667 A1 | 8/2016 | Palmisano et al. | |
| 2016/0253852 A1 | 9/2016 | Bertness et al. | |
| 2016/0266212 A1 | 9/2016 | Carlo | |
| 2016/0285284 A1 | 9/2016 | Matlapudi et al. | |
| 2016/0321897 A1 | 11/2016 | Lee | |
| 2016/0336623 A1 | 11/2016 | Nayar | |
| 2016/0381542 A1 | 12/2016 | Colby | |
| 2017/0093056 A1 | 3/2017 | Salo, III et al. | |
| 2017/0146602 A1 | 5/2017 | Samp | |
| 2017/0158058 A1 | 6/2017 | Lee et al. | |
| 2017/0373410 A1 | 12/2017 | Lipkin et al. | |
| 2018/0009328 A1 | 1/2018 | Hinterberger et al. | |
| 2018/0113171 A1 | 4/2018 | Bertness | |
| 2018/0301913 A1 | 10/2018 | Irish et al. | |
| 2018/0306867 A1 | 10/2018 | Bertness | |
| 2019/0105998 A1 | 4/2019 | Bertness | |
| 2019/0152332 A1 | 5/2019 | Bertness | |
| 2019/0154763 A1 | 5/2019 | Bertness | |
| 2019/0204392 A1 | 7/2019 | Bertness | |
| 2020/0076129 A1 | 3/2020 | Kitahara | |
| 2020/0086757 A1 | 3/2020 | Vain et al. | |
| 2020/0161630 A1 | 5/2020 | Zeng | |
| 2020/0174078 A1 | 6/2020 | Salo, III et al. | |
| 2020/0274370 A1 | 8/2020 | Krieg | |
| 2021/0048374 A1 | 2/2021 | Sampson et al. | |
| 2021/0049480 A1 | 2/2021 | Kale et al. | |
| 2021/0135462 A1 | 5/2021 | Sampson et al. | |
| 2021/0141021 A1 | 5/2021 | Salo, III et al. | |
| 2021/0141043 A1 | 5/2021 | Bertness | |
| 2021/0203016 A1 | 7/2021 | Bertness | |
| 2021/0231737 A1 | 7/2021 | Salo, III et al. | |
| 2021/0325471 A1 | 10/2021 | Bertness | |
| 2022/0050142 A1 | 2/2022 | Bertness | |
| 2022/0258619 A1 | 8/2022 | Bertness | |
| 2022/0384858 A1 | 12/2022 | Bertness | |
| 2023/0063349 A1 | 3/2023 | Bertness et al. | |
| 2023/0155400 A1 | 5/2023 | Wang | |
| 2023/0256829 A1 | 8/2023 | Bertness | |
| 2023/0318321 A1* | 10/2023 | Liu | H02J 7/0047 320/105 |
| 2023/0333171 A1 | 10/2023 | Bertness | |
| 2023/0339359 A1 | 10/2023 | Numata | |
| 2023/0358818 A1 | 11/2023 | Kolamkar et al. | |
| 2023/0387707 A1 | 11/2023 | Bertness | |
| 2023/0391179 A1 | 12/2023 | Sampson et al. | |
| 2024/0429653 A1 | 12/2024 | Dos Santos | |

FOREIGN PATENT DOCUMENTS

| | | |
|---|---|---|
| CN | 103091633 | 5/2013 |
| CN | 206658084 | 11/2017 |
| CN | 109683054 | 1/2019 |
| DE | 29 26 716 B1 | 1/1981 |
| DE | 40 07 883 | 9/1991 |
| DE | 196 38 324 | 9/1996 |
| DE | 601 12 502 T2 | 6/2006 |
| DE | 10 2009 013 857 | 10/2009 |
| DE | 10 2008 036 595 A1 | 2/2010 |
| DE | 10 2018 001885 | 9/2018 |
| DE | 10 2020 216599 | 7/2021 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 786 057 | 5/2007 |
| EP | 1 807 710 B1 | 7/2007 |
| EP | 1 807 710 | 1/2010 |
| EP | 2 302 724 | 3/2011 |
| FR | 2 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |
| GB | 2 266 150 | 10/1993 |
| GB | 2 275 783 A | 7/1994 |
| GB | 2 353 367 | 2/2001 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |

(56) References Cited

FOREIGN PATENT DOCUMENTS

| JP | 11-150809 | 6/1999 |
|---|---|---|
| JP | 11-271409 | 10/1999 |
| JP | 2001-023037 | 1/2001 |
| JP | 2001057711 A | 2/2001 |
| JP | 2003-346909 | 12/2003 |
| JP | 2005-238969 | 9/2005 |
| JP | 2006/242674 | 9/2006 |
| JP | 2006331976 A | 12/2006 |
| JP | 2009-244166 | 10/2009 |
| JP | 2009-261174 | 11/2009 |
| JP | 2010-172122 | 5/2010 |
| JP | 2010-172142 | 8/2010 |
| JP | 2011-216328 | 10/2011 |
| JP | 2013-110069 | 6/2013 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | WO 2007/059935 | 5/2007 |
| WO | WO 2007/075403 | 7/2007 |
| WO | WO 2009/004001 | 1/2009 |
| WO | WO 2010/007681 | 1/2010 |
| WO | WO 2010/035605 | 4/2010 |
| WO | WO 2010/042517 | 4/2010 |
| WO | WO 2011/153419 | 12/2011 |
| WO | WO 2012/078921 | 6/2012 |
| WO | WO 2013/070850 | 5/2013 |
| WO | 2016/176405 | 11/2016 |
| WO | 2022/241800 | 11/2022 |

OTHER PUBLICATIONS

U.S. Appl. No. 18/609,344, filed Mar. 19, 2024.
"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining The End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477. pp. 128,131.
IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
National Semiconductor Corporation, "LMF90-$4^{th}$-Order Elliptic Notch Filter", Dec. 1994, RRD-B30M115, Dec. 1994.
"Alligator Clips with Wire Penetrators" *J. S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe,com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powerdesigners.com/InforWeb.design_center/articles/DC-DC/converter.shtm, prior to Oct. 1, 2002.
"Notification of Transmittal of The International Search Report or the Declaration", PCT/US02/29461, filed Sep. 17, 2002 and mailed Jan. 3, 2003.
"Notification of Transmittal of The International Search Report or the Declaration", PCT/US03/07546, filed Mar. 13, 2003 and mailed Jul. 4, 2001.
"Notification of Transmittal of The International Search Report or the Declaration", PCT/US03/06577, filed Mar. 5, 2003 and mailed Jul. 24, 2003.
"Notification of Transmittal of The International Search Report or the Declaration", PCT/US03/07837, filed Mar. 14, 2003 and mailed Jul. 4, 2003.
"Improved Impedance Spectroscopy Technique For Status Determination of Production $Li/SO_2$ Batteries" Terrill Atwater et al., pp. 10-113, (1992).
"Notification of Transmittal of The International Search Report or the Declaration", PCT/US03/41561; Search Report completed Apr. 13, 2004, mailed May 6, 2004.
"Notification of Transmittal of The International Search Report or the Declaration", PCT/US03/27696, filed Sep. 4, 2003 and mailed Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and mailed Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447. 4, date of search Jan. 27, 2005, date of document Jan. 28, 2005.

(56) References Cited

OTHER PUBLICATIONS

"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.
"Examination Report" from the UK Patent Office for App. No. 0417678. 0; Jan. 24, 2005.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, San Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, date of mailing Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used In Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™M/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et al., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV Plus Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.

(56) References Cited

OTHER PUBLICATIONS

Notification of Transmittal of the International Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/029696, dated Aug. 24, 2016.
Office Action from German Patent Application No. 10393251.8, dated Nov. 4, 2016, including English translation.
Office Action from European Patent Application No. 15 151 426.2-1801, dated Aug. 28, 2017, 2 pages.
Office Action from German Patent Application No. 112011101892.4, dated Sep. 7, 2017.
Office Action from Japanese Patent Application No. 2017-026740, dated Jan. 9, 2018.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.
U.S. Appl. No. 12/697,485, filed Feb. 1, 2010, 36 pgs.
Office Action from Chinese Patent Application No. 201480066251.8, dated Dec. 13, 2018.
Notification of Transmittal of the International Search Report and the Written Opinion of the International Searching Authority, or the Declaration for PCT/US2019/014487, dated Apr. 11, 2019.
Notification of Transmittal of the International Search Report and the Written Opinion of the International Searching Authority, or the Declaration for PCT/US2019/014494, dated Apr. 24, 2019.
Office Action from German Patent Application No. 11 2011 101 892.4, dated Oct. 1, 2020, and translation using Google Translate.
Wikipedia Online Encyclopedia, https: // de.wikipedia.org/w/index.php?title= four-wire measurement & oldid=67143514-4 (Retrieved Sep. 15, 2020) along with Google Translation.
Notification of Transmittal of the International Search Report and the Written Opinion of the International Searching Authority, or the Declaration for PCT/US2020/059015, dated Jan. 22, 2021.
U.S. Appl. No. 17/504,897, filed Oct. 19, 2021.
Notification of Transmittal of the International Search Report and the Written Opinion of the International Searching Authority, or the Declaration for PCT/US2021/040313 dated Oct. 25, 2021; 14 pages.
U.S. Appl. No. 17/893,412, filed Aug. 23, 2022.
U.S. Appl. No. 18/166,702, filed Feb. 9, 2023.
U.S. Appl. No. 18/314,266, filed May 9, 2023.
U.S. Appl. No. 18/324,382, filed May 26, 2023.
U.S. Appl. No. 18/328,827, filed Jun. 5, 2023.
International Search Report for the Corresponding International Patent Application No. PCT/US2024/033558, dated Sep. 3, 2024, dated Jun. 12, 2024, 5 pages.
Written Opinion for the Corresponding International Patent Application No. PCT/US2024/033558, dated Sep. 3, 2024, dated Jun. 12, 2024, 8 pages.
International Search Report and Written Opinion for corresponding International Application No. PCT/US2024/053504, dated Jan. 21, 2025, 15 pages.
George Coulouris et al. "Distributed Systems: Concepts and Design (5th edition)", Addison-Wesley, May 7, 2011.
Gehrmann Christian et al: "Bluetooth Security" Artech House Publishers, Jul. 5, 2004.
Owen C. Duffey et al. "Fundamentals of Medium/Heavy Duty Commercial Vehicle Systems," Jones & Bartlett Learning, Jul. 27, 2015.
Wikipedia: "List of Bluetooth profiles," Internet Article, Oct. 6, 2023.
Nick Hunn et al. "Essentials of Short-Range Wireless," Cambridge University Press, Aug. 23, 2010.
International Search Report and Written Opinion for corresponding International Application No. PCT/US2024/051765, dated Jan. 16, 2025, 15 pages.

\* cited by examiner

ELECTRONIC BATTERY TESTER

CROSS-REFERENCE TO RELATED APPLICATION

The present application is based on and claims the benefit of U.S. provisional patent application Ser. No. 63/339,618, filed May 9, 2022, the content of which is hereby incorporated by reference in its entirety.

BACKGROUND

The present invention relates to battery testers of the type used to test storage batteries. More specifically, the present invention relates to a battery maintenance system with improved battery test accuracy.

Electrical systems, such as those that are used in automotive vehicles, consist of a number of discrete components or systems which are interconnected. As used herein, the term "automotive vehicle" includes both vehicles which utilize an internal combustion engine, vehicles which utilize electric motors, as well as hybrid vehicles which include both types of systems. Techniques for measuring and utilizing parameters of electrical systems of automotive vehicles are known. Examples of various types of battery testers, monitors and other related equipment are set forth in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Pat. No. 9,244,100, issued Jan. 26, 2016; U.S. Pat. No. 9,255,955, issued Feb. 9, 2016; U.S. Pat. No. 9,274,157, issued Mar. 1, 2016; U.S. Pat. No. 9,312,575, issued Apr. 12, 2016; U.S. Pat. No. 9,335,362, issued May 10, 2016; U.S. Pat. No. 9,425,487, issued Aug. 23, 2016; U.S. Pat. No. 9,419,311, issued Aug. 16, 2016; U.S. Pat. No. 9,496,720, issued Nov. 15, 2016; U.S. Pat. No. 9,588,185, issued Mar. 7, 2017; U.S. Pat. No. 9,923,289, issued Mar. 20, 2018; U.S. Pat. No. 9,966,676, issued May 8, 2018; U.S. Pat. No. 10,046,649, issued Aug. 14, 2018; U.S. Pat. No. 10,222,397, issued Mar. 5, 2019; U.S. Pat. No. 10,317,468, issued Jun. 11, 2019; U.S. Pat. No. 10,429,449, issued Oct. 1, 2019; U.S. Pat. No. 10,473,555, issued Nov. 12, 2019; U.S. Pat. No. 10,608,353, issued Mar. 31, 2020; U.S. Pat. No. 10,843,574, issued Nov. 24, 2020; U.S. Pat. No. 11,054,480, issued Jul. 6, 2021; U.S. Pat. No. 11,325,479, issued May 10, 2022; U.S. Pat. No. 11,474,153, issued Oct. 18, 2022; U.S. Pat. No. 11,486,930, issued Nov. 1, 2022; U.S. Pat. No. 11,513,160, issued Nov. 29, 2022; U.S. Pat. No. 11,545,839, issued Jan. 3, 2023; U.S. Pat. No. 11,548,404, issued Jan. 10, 2023; U.S. Pat. No. 11,566,972, issued Jan. 31, 2023; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 11/356,443, filed Feb. 16, 2006, entitled ELECTRONIC BATTERY TESTER WITH NETWORK COMMUNICATION; U.S. Ser. No. 12/697,485, filed Feb. 1, 2010, entitled ELECTRONIC BATTERY TESTER; U.S. Ser. No. 12/769,911, filed Apr. 29, 2010, entitled STATIONARY BATTERY TESTER; U.S. Ser. No. 13/152,711, filed Jun. 3, 2011, entitled BATTERY PACK MAINTENANCE FOR ELECTRIC VEHICLE; U.S. Ser. No. 14/039,746, filed Sep. 27, 2013, entitled BATTERY PACK MAINTENANCE FOR ELECTRIC VEHICLE; U.S. Ser. No. 14/565,589, filed Dec. 10, 2014, entitled BATTERY TESTER AND BATTERY REGISTRATION TOOL; U.S. Ser. No. 15/017,887, filed Feb. 8, 2016, entitled METHOD AND APPARATUS FOR MEASURING A PARAMETER OF A VEHICLE ELECTRICAL SYSTEM; U.S. Ser. No. 15/049,483, filed Feb. 22, 2016, entitled BATTERY TESTER FOR ELECTRIC VEHICLE; U.S. Ser. No. 15/077,975, filed Mar. 23, 2016, entitled BATTERY MAINTENANCE SYSTEM; U.S. Ser. No. 15/149,579, filed May 9, 2016, entitled BATTERY TESTER FOR ELECTRIC VEHICLE; U.S. Ser. No. 16/021,538, filed Jun. 28, 2018, entitled BATTERY PACK MAINTENANCE FOR ELECTRIC VEHICLE; U.S. Ser. No. 16/253,526, filed Jan. 22, 2019, entitled HIGH CAPACITY BATTERY BALANCER; U.S. Ser. No. 16/297,975, filed Mar. 11, 2019, entitled HIGH USE BATTERY PACK MAINTENANCE; U.S. Ser. No. 17/086,629, filed Nov. 2, 2020, entitled HYBRID AND ELECTRIC VEHICLE BATTERY PACK MAINTENANCE DEVICE; U.S. Ser. No. 17/136,600, filed Dec. 29, 2020, entitled INTELLIGENT MODULE INTERFACE FOR BATTERY MAINTENANCE DEVICE; U.S. Ser. No. 17/364,953, filed Jul. 1, 2021, entitled ELECTRICAL LOAD FOR ELECTRONIC BATTERY TESTER AND ELECTRONIC BATTERY TESTER INCLUDING SUCH ELECTRICAL LOAD; U.S. Ser. No. 17/504,897, filed Oct. 19, 2021, entitled HIGH CAPACITY BATTERY BALANCER; U.S. Ser. No. 17/739,393, filed May 9, 2022, entitled HYBRID AND ELECTRIC VEHICLE BATTERY PACK MAINTENANCE DEVICE; U.S. Ser. No. 17/750,719, filed May 23, 2022, entitled BATTERY MONITORING SYSTEM; U.S. Ser. No. 17/893,412, filed Aug. 23, 2022, entitled POWER ADAPTER FOR AUTOMOTIVE VEHICLE MAINTENANCE DEVICE; U.S. Ser. No. 18/166,702, filed Feb. 9, 2023, entitled BATTERY MAINTENANCE DEVICE WITH HIGH VOLTAGE CONNECTOR; all of which are incorporated herein by reference in their entireties.

There is an ongoing need for improved battery testing and diagnostic equipment.

SUMMARY

An electronic battery tester for testing a storage battery in an automotive vehicle includes first test circuitry configured to couple to the storage battery, apply a forcing function to the storage battery, measure a response of the storage battery to the applied forcing function and provide a battery test output related to a condition of the battery based upon the response of the battery to the applied forcing function Starter voltage measurement circuitry electrically couples to a starter motor of the automotive vehicle and collects starter voltage profile information comprising a plurality of starter voltage measurements obtained at different times while operating the starter motor. Second test circuitry receives the battery test output from the first test circuitry and the starter voltage profile information and provides an enhanced battery test output related to the condition of the battery based upon the battery test output and the starter voltage profile information.

DETAILED DESCRIPTION OF ILLUSTRATIVE EMBODIMENTS

Battery testers are known in the art and used for performing tests on batteries of automotive vehicles. There are various testing technique that are known including physical chemical measurements as well as electronic battery testers. Electronic battery testers generally use two primary techniques for measuring battery state of health and battery condition. One technique is to apply a load or a charge to the battery and observe how energy is removed from the battery, or added to the battery, to make a determination of battery condition. Another technique is to apply a signal to the battery and watch a response of the battery to the applied signal. As discussed in the Background section, Midtronics, Inc. along with Dr. Keith S. Champlin have pioneered the field of electronic battery testing. One technique employed is the application of a forcing function and the observation of the resultant change in a battery electrical dynamic parameter.

However, there is an ongoing need for improved accuracy of battery tests. The battery tests should preferably be able to be performed in a short period of time and deliver accurate results. With the present invention, data is collected from an automotive vehicle while a starter motor of the vehicle is engaged to start an engine of the vehicle. This additional data is used to provide a battery test result. The battery test result can be based solely upon the data collected during the starting sequence or may also include additional data such as additional battery test data, batter charging data, or battery discharging data. The data collected during starting of the vehicle provides a starting voltage profile, which includes voltage information along with time information. This starter voltage profile is then correlated with battery condition. In a more specific configuration, first test circuitry is used to couple to a storage battery of the vehicle, apply a forcing function to the storage battery of the vehicle and measure a response of the storage battery to the applied forcing function. This is used to provide a battery test output related to a condition of the battery. A starter voltage measurement circuit is electrically coupled to the starter motor of the automotive vehicle and collects starter voltage profile information comprising a plurality of starter voltage measurements obtained at different times during operation of the starter motor. Second test circuitry is then configured to receive the battery test output and the starter voltage profile information. The second test circuitry provides an enhanced battery test output related to the condition of the battery which has improved accuracy over the battery test output provided by the first test circuitry.

Figure 1:
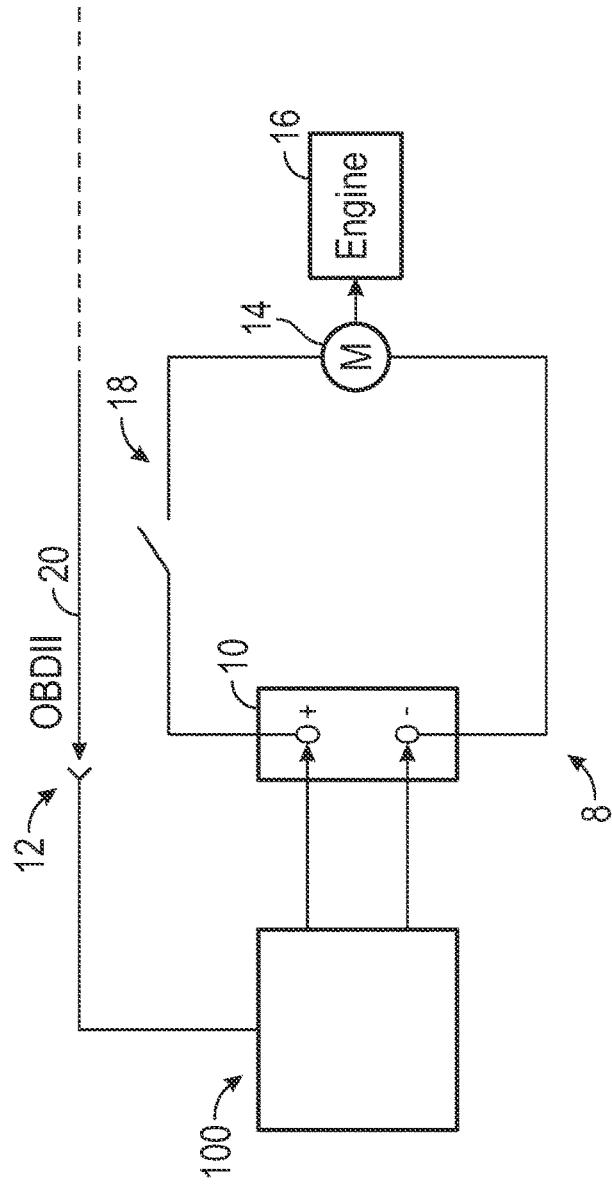
FIG. 1 is a simplified schematic diagram showing a battery maintenance system coupled to a battery of an automotive vehicle.

FIG. 1 is a simplified block diagram showing a battery maintenance system 100 coupled to an automotive vehicle 8. The automotive vehicle 8 is illustrated as a battery 10, a starter motor 14, an engine 16 and a starter relay switch 18. The vehicle 8 also includes an internal data bus illustrated as an OBDII data bus 20. The battery maintenance system 100 also includes an OBDII connector 12. As discussed more herein, battery maintenance system 100 performs electrical measurements on battery 10 using an electrical connection to the battery 10. To collect starter profile information, the starter relay 18 is closed, which provides an electrical connection to the starter motor 14. The starter motor 14 is caused to rotate thereby rotating the engine 16 allowing the engine 16 to start. During the starting sequence, data is collected by battery maintenance system 100 using the connection to battery 10. The profile information includes a plurality of measurements taken over a time period. This time period can include time both before the starter relay switch 18 is closed and after the starter relay switch 18 is opened. Example data measurements include voltage measurements. Another example data measurement is a current measurement, for example, obtained using an amp clamp (not shown in FIG. 1).

Figure 2:
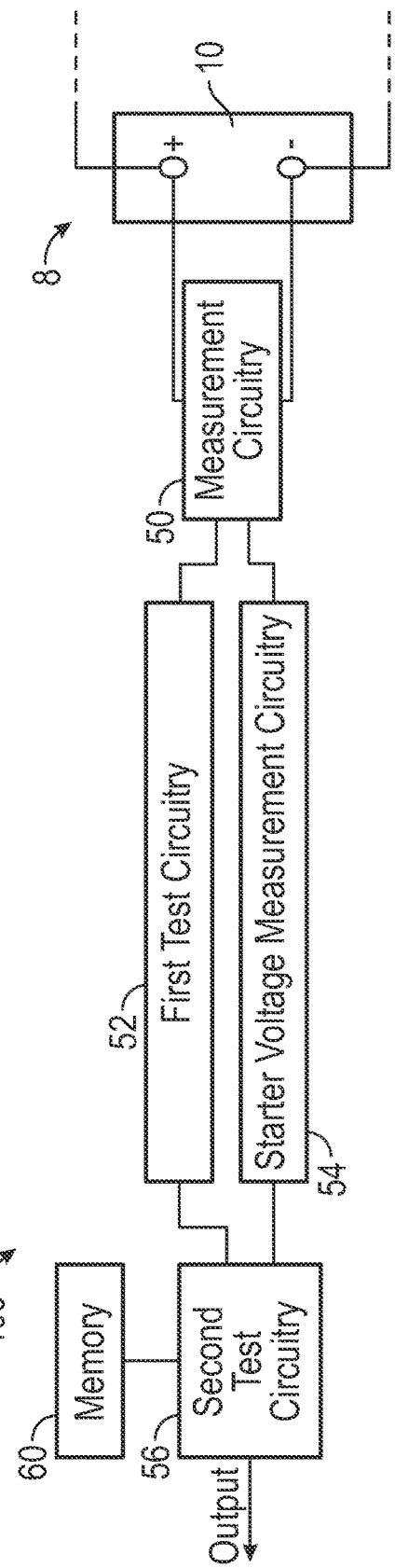
FIG. 2 is a simplified block diagram of the battery maintenance system of FIG. 1.

FIG. 2 is a simplified block diagram of battery maintenance system 100 including measurement circuitry 50 connected to storage battery 10. Measurement circuitry 50 provides outputs to first test circuitry 52 and starter voltage measurement circuitry 54. As discussed herein, the first test circuitry 52 can perform a battery test on the battery 10 using measurement circuitry 50 by applying a forcing function to the battery 10 and observing a resultant dynamic electrical parameter of the battery 50. Starter voltage measurement circuitry also couples to measurement circuitry 50 and measures a voltage across the battery 10 while the starter motor 14 shown in FIG. 1 is operated. In one configuration, the device 100 determines that the starter motor is being operated by observing a voltage drop in the measured voltage across the battery 10. In another example configuration, starting information is collected using the data bus 20 of the vehicle. Further, an operator can be prompted, for example using display 220 illustrated in FIG. 6, to engage the starter motor. The collected profile data can comprise, for example, a series of data points collected over a period of time at variable or fixed time intervals. Second test circuitry 56 is configured to receive a battery test result from first test circuitry 52 along with the starter profile information provided by the starter voltage measurement circuitry 54. The second test circuitry provides an enhanced battery test output based upon the battery test result provided by the first test circuitry along with the starter voltage profile information provided by starter voltage measurement circuitry 54. The second test circuitry 56 couples to a memory 60 which contains data which relates starter voltage profile information to a condition of battery 10. This data correlates voltages along with profile information such as rate of change of measured voltage, minimum and maximum voltage levels, the shape of the profile, etc., to the condition of battery 10. The second test circuitry can use this to verify the battery test determination provided by first test circuitry 52 or can use this information to improve the accuracy of the battery test information provided by first test circuitry 52. In another example configuration, if the battery test result provided by first test circuitry 52 differs significantly from the battery condition determine obtained using the starter voltage profile information, second test circuitry can provide a battery test output based solely on the starter voltage profile information.

Figure 3:
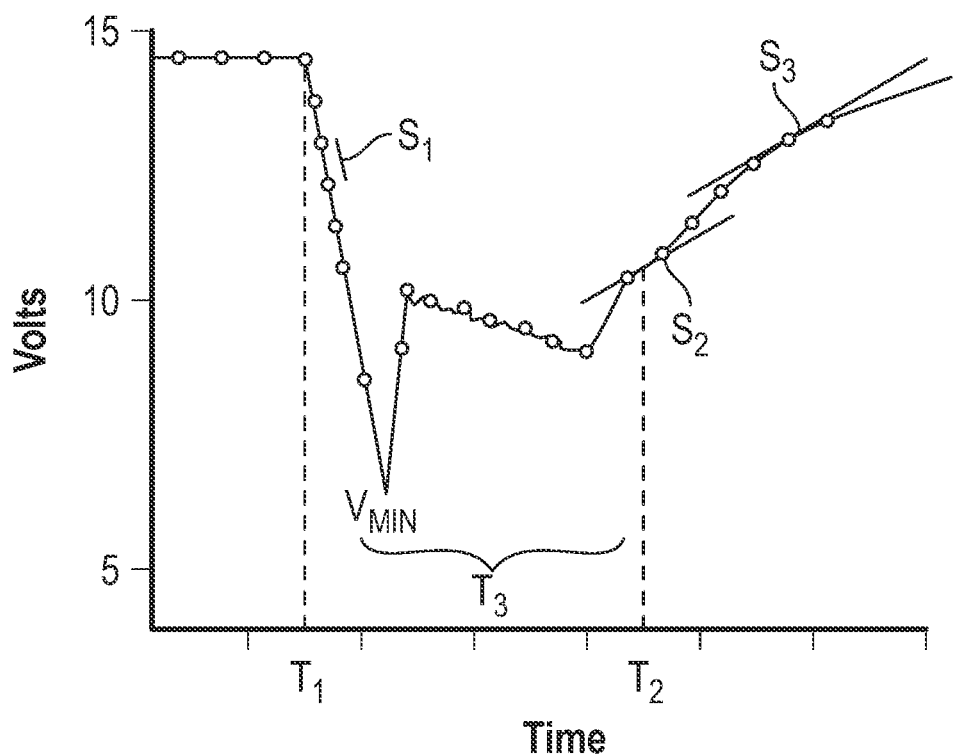
FIG. 3 is a graph of voltage versus time showing a starter voltage profile.

FIG. 3 is a graph of voltage versus time and is an illustration of one example starter voltage profile. FIG. 3 shows a series of dots which represent individual samples of voltage at particular times. In this configuration, the time between samples is evenly spaced. However, the data points need not be linearly spaced in time and can vary as desired. Additional data points can be used when the profile is changing rapidly to provide for greater accuracy. The voltage profile provides a number of different types of data. As shown, the profile provides voltages both before the starter motor engages at time T1 as well as information after power is removed from the starter motor 14 by relay 18 at time T2. This allows information to be collected related to the rate at which the voltage drops when the starter motor is engaged illustrated as a slope S1 along with information related to the rate of voltage recovery illustrated as slopes S2 and S3. Voltage minimums and/or maximums can also be collected. Further, operation of the starter motor 14 introduces noise on the voltage measurements which can be seen during time period T3.

Figure 4:
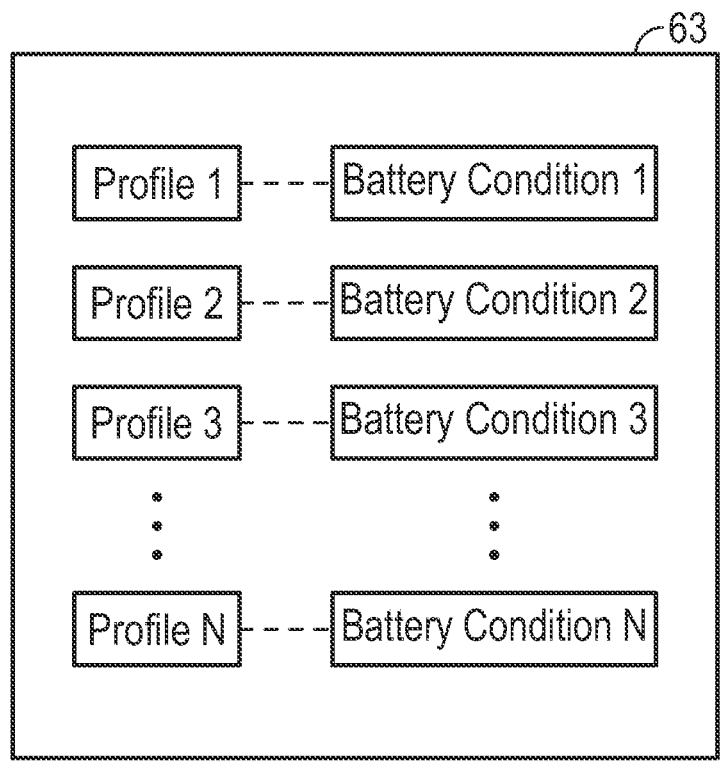
FIG. 4 illustrates a starter voltage profile data set stored with a battery condition data set.

FIG. 4 shows an example of datasets stored in array 63 which can be kept in memory 60. The datasets include a series of starter motor voltage profile measurements indicated as profile 1, profile 2, profile 3, . . . profile N. These profiles are a series of data points such as those discuss in connection with FIG. 3. If the data points are collected at fixed or known intervals, time information does not need to be stored. Also stored in array 63 is a dataset of battery condition information. This is indicated as battery condition 1, battery condition 2, battery condition 3, . . . battery condition N. The battery condition information is preferably obtained from the same battery from which the starter voltage profile information was obtained. The battery condition information can be obtained using any battery testing technique and can comprise, for example, battery state of charge, battery state of health, a pass/fail determination, or other battery condition. This can be determined, for example, using a measurement of a dynamic parameter in response to an applied forcing function, a load test, a charge acceptance test, a chemical test, a test of a physical property such as specific gravity, or other testing techniques. In one specific configuration, measurement circuitry 50 shown in FIG. 2 is used to apply a load test to battery 10 in which a load is applied across the battery and battery voltage and current flow is monitored as the battery is discharged. This can be used to make an accurate assessment of the amount of charge stored in the battery 10 and also used to determine battery health information. In a similar test, measurement circuitry 50 is used to apply a charge to the battery 10 and charge acceptance is monitored in order to determine battery state of health and battery condition. The starter voltage profile information for the associated battery is also stored in the memory. The array 63 can include other parameters obtained during battery testing such as battery voltage, current draws, temperature, battery type, battery rating, etc. Thus, in one example configuration, a starter voltage profile is obtained as discussed above and compared with the various profiles stored in array 63. To determine the enhanced battery test output, a starter voltage profile is collected for a battery under test and a stored profile is selected which most closely matches the measured profile. The battery condition of the selected profile is identified and used to provide an enhanced battery test output indicative of the condition of the battery 10. The particular matching technique can be selected as desired and can be a technique which matches the voltages at various time sequences and identifies the profile which most closely matches. Other techniques include matching slopes or rates of change such as S1, S2 and S3 illustrated in FIG. 3. The amount of noise during the time period T3 and voltage minimums or maximums can also be used in the matching period.

The enhanced battery test output can be determined using any number of techniques, including machine learning. One example technique is a series of steps used to provide the output. For example, if the first battery test provides a battery dynamic conductance which indicates a good battery, but the starter voltage profile shows an unusually large voltage drop, a determination can be made that the battery is actually bad. The data set used to make these determinations can also include battery voltage, battery rating, temperature, current measurements, etc.

Figure 5:
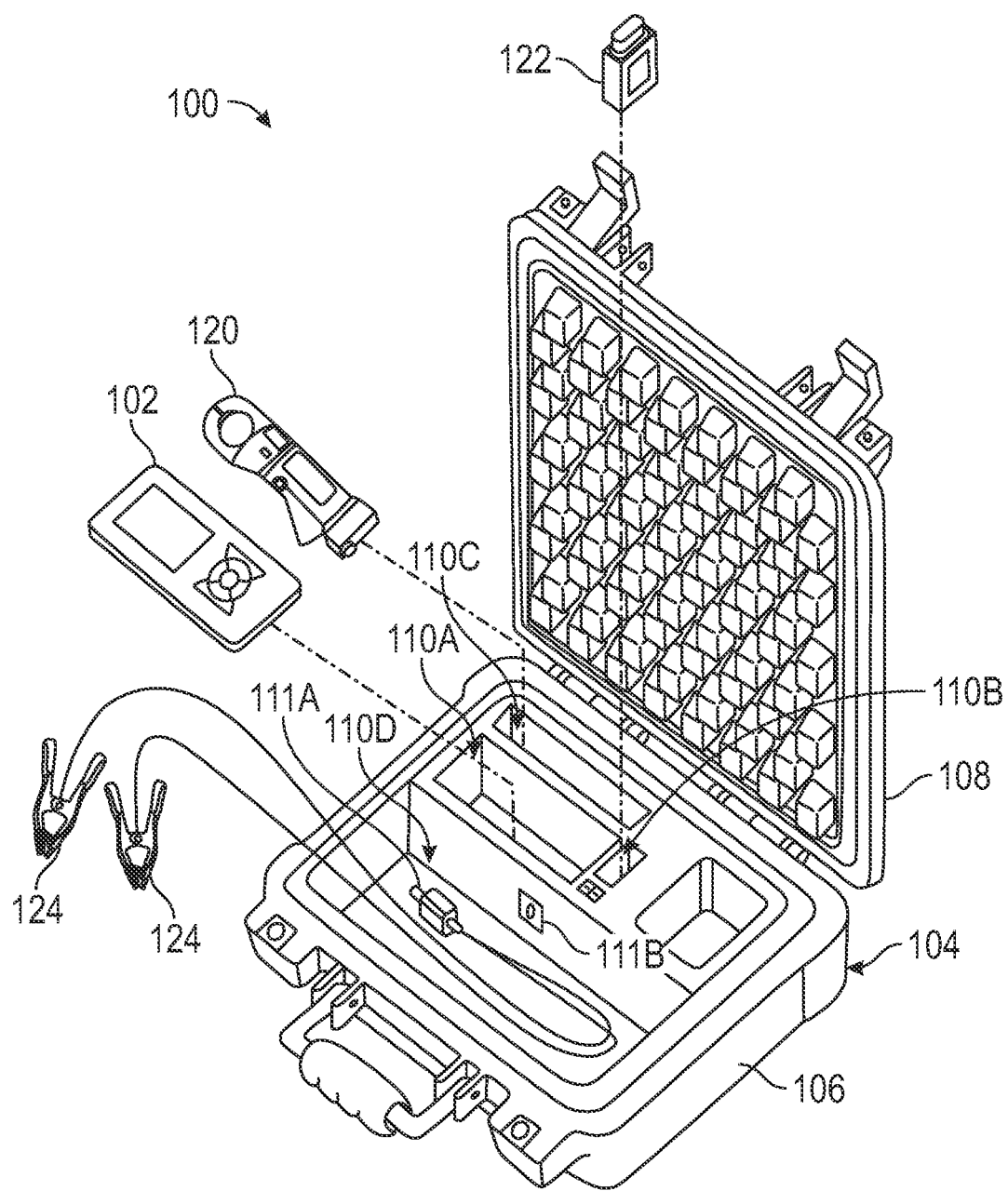
FIG. 5 is a perspective view of the automotive battery diagnostic or maintenance system of FIG. 1 in accordance with one example embodiment.

FIG. 5 is an exploded view of a battery maintenance system 100 in accordance with one example embodiment. Battery maintenance system 100 includes an electronic battery tester 102 and a base station 104. Base station 104 includes a base 106 and a cover or lid 108. In the configuration shown in FIG. 5, base station 104 is configured for portable operation, however, a fixed or less mobile base station configuration may also be employed.

The base station 104 includes a number of receiving areas 110A-D for receiving various components (or accessories) of the battery maintenance system 100. For example, battery tester 102 is received in receiving area 110A. FIG. 5 also illustrates an amp clamp (current sensor) 120 which is received in receiving area 110C, a OBDII communicator 122 which is received in receiving area 110B and Kelvin connectors 124 which are received in receiving area 110D.

Any number of battery maintenance tools or accessories may be contained in receptacles of the base station 104 and the invention is not limited to those specifically discussed herein. Additionally, the Kelvin connectors 124 are illustrated as being connected to a plug connector 111A. This plug connector may be used for coupling the cabling to the battery tester 102. Additionally, the plug 111A may be plugged into a socket 111B carried in the base station 104. The socket 111B may be used in a configuration in which a battery carried within the base station 104 is used for jump starting the vehicle. In another example configuration, battery testing circuitry, or other testing circuitry is carried in base station 104 and electrically coupled to Kelvin connectors 124 through plug 111A and socket 111B.

Figure 6:
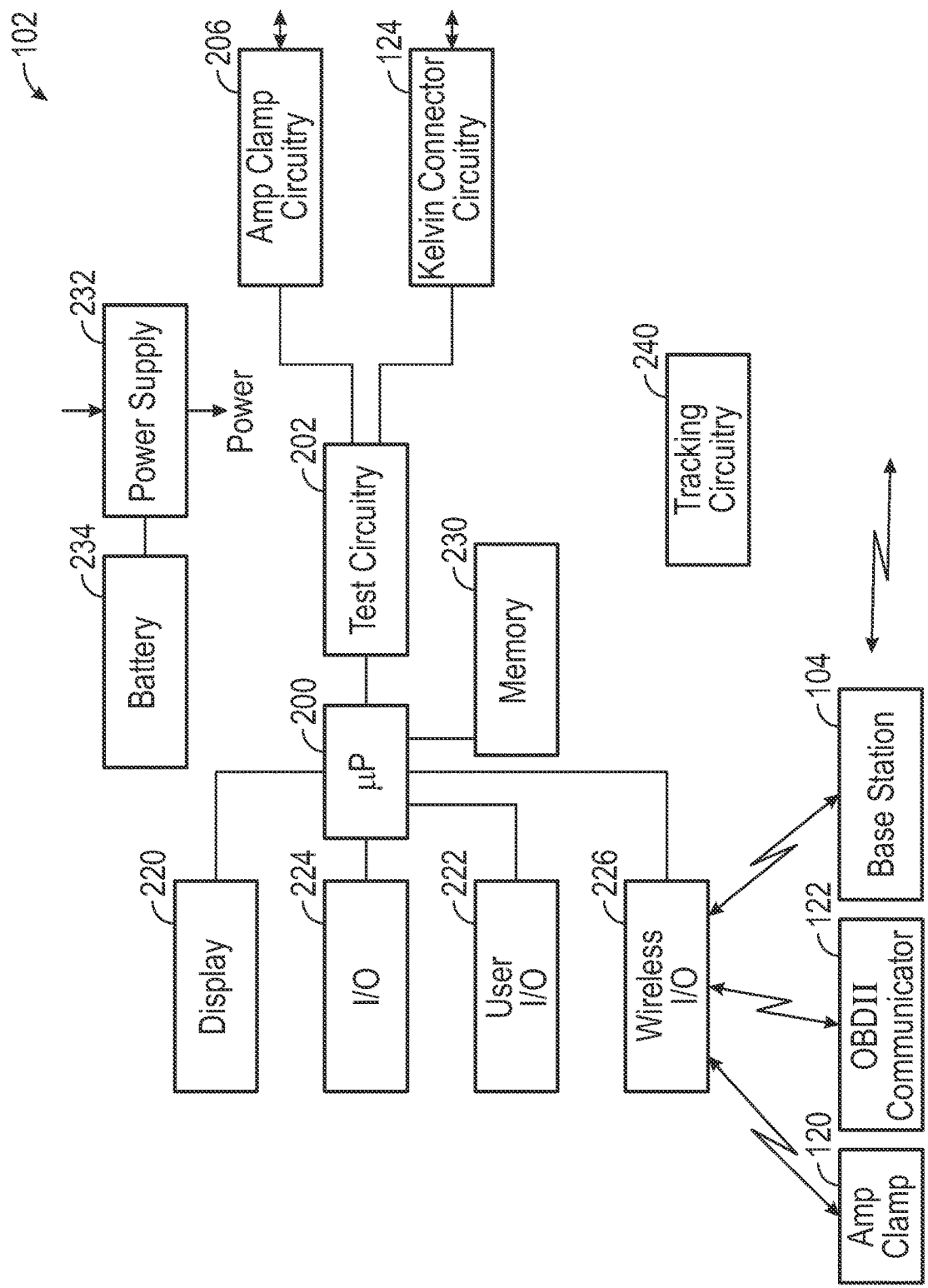
FIG. 6 is a simplified block diagram of a system of FIG. 1.

FIG. 6 is a simplified block diagram showing components and circuitry of the electronic battery tester 102. Battery tester 102 includes a microprocessor 200 coupled to battery test circuitry 202. Battery test circuitry 202 may operate in accordance with any battery testing procedure and one example procedure is discussed below in more detail. Battery test circuitry 202 is shown as coupled to Kelvin connector circuitry 204 and amp clamp circuitry 206. Microprocessor also couples to a display 220 and user input/output 222. An additional input/output circuitry 224 is illustrated along with wireless input/output circuitry 226. Microprocessor 200 operates in accordance with instructions stored in memory 230. A power supply 232 is illustrated and coupled to an optional battery 234. Power supply 232 may obtain power through the connection to a battery under test, may obtain power through internal battery 234, may obtain power through the base station 104, or from some other source. In one configuration, battery 234 is charged when the battery tester 102 is coupled to a battery under test or when the battery tester 102 is coupled to base station 104.

In the configuration illustrated in FIG. 6, the various components of the battery maintenance device 100 shown in FIG. 2 are implemented using a number of different blocks in the Figure. For example, measurement circuitry 50 can be implemented in block 202. This can include, for example, a forcing function, a voltage measurement circuit, and/or a current measurement circuitry. The first test circuitry 52, starter voltage measurement circuitry 54 and second test circuitry 56 can be implemented in microprocessor 200. The memory 60 of FIG. 2 can be a wholly or partially implement in memory 230 of FIG. 6.

During operation, microprocessor 200 performs a test on a storage battery using connector circuitry 204 and optional amp clamp circuitry 206. The amp clamp circuitry 206 may also be used to test other electrical components of an automotive vehicle such as, for example, a starter motor. The connection to the amp clamp 120 shown in FIG. 5 through amp clamp circuitry 206 may be a wired connection, or, for example, may be a wireless connection through wireless I/O 226. Wireless I/O circuitry 226 may also be used to communicate with the OBDII communicator 122 and/or base station 104. Base station 104 may also be used to relay communications to another location, such as a centralized location.

The microprocessor 200 provides information to an operator using, for example, display 220 and may receive commands or other user input through user I/O 222. I/O 224 may be used for communicating with other components or devices. For example, a remote printer may be accessed using circuitry 224. The microprocessor can communicate with the OBDII databus of the vehicle using the OBDII communicator 122. For example, this information can be used to determine information about the vehicle under test, information about usage of the vehicle under test, information about the storage battery of the vehicle or other information related to the vehicle. Further, the communicator 122 may be used to provide data signals onto the OBDII databus of the vehicle. This may also be used to store information or other parameters in the vehicle, or control operation of components of the vehicle.

FIG. 6 also illustrates tracking circuitry 240 which is used by circuitry in base station 104 to identify a location of the battery tester 102. For example, the tracking circuitry may include addressing information whereby base station 104 may identify a unique battery tester 102 when it is placed into the receiving area 110A of the base 106 shown in FIG. 5. Note that the receiving area 110A illustrated in FIG. 5 may also include an electrical connection for coupling to power supply 232 of the battery tester 102.

Figure 7:
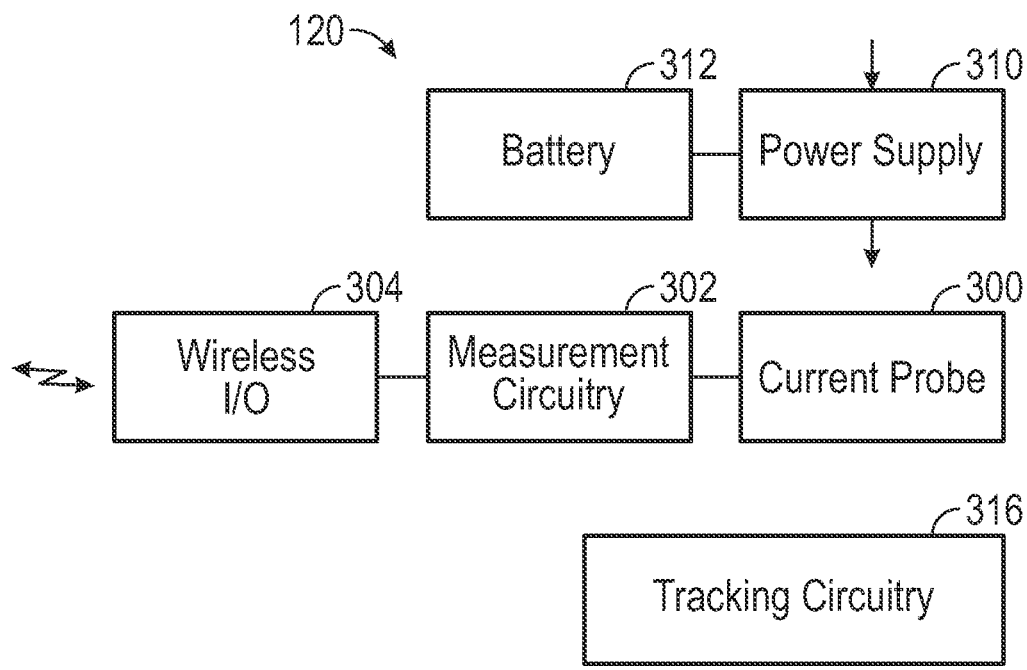
FIG. 7 is a simplified block diagram of an amp clamp/current sensor.

FIG. 7 is a simplified block diagram of amp clamp/current sensor 120. Sensor 120 includes a current probe 300 coupled to measurement circuitry 302. Probe 300 may operate in accordance with any appropriate technique for a particular use. Such techniques include inductive coupling, the use of a Hall Effect sensor, or some other technique including a shunt. Measurement circuitry provides an output to wireless I/O circuitry 304 related to the measured current. This information is transmitted wirelessly to the battery tester 102 shown in FIG. 6. The current sensor 120 includes a power supply circuit 310 for providing power to the device. An internal battery 312 may be used for storing power. The battery 312 may be charged, for example, through a connection through power supply 310 to the receiving area 110C of base station 104. Tracking circuitry 326 is also provided.

FIG. 7 also illustrates an optional optical sensor 320 carried by current sensor 120. Optical sensor 320 may be used to receive optical information such as, for example, information provided by a barcode. The optical sensor 320 can be used to read information from the vehicle, for example, a VIN identification number of the vehicle, as well as information related to various components of the vehicle including serial numbers carried on storage batteries or other components of the vehicle. In another example configuration, optical sensor 320 comprises an infrared sensor for use in sensing temperature of various components of the vehicle or other components. For example, battery temperature can be used as part of a battery test.

In another example configuration, the system 100 can be used for providing a jumpstart to a battery of a vehicle. In one such example configuration, the internal battery 234 of tester 102 is coupled to Kelvin connector circuitry 204 to apply a voltage to the battery for starting the vehicle using Kelvin connectors 124. In such a configuration, the battery 234 should be able to deliver sufficient current at a high enough voltage to activate the starter motor of the vehicle. For example, a rechargeable lithium battery may be employed. In another related configuration, a "memory saver" function is provided by system 100. This can be used if the battery of a vehicle is disconnected or removed from the vehicle in order to maintain the memory and other stored information within the vehicle. For example, the vehicle may be powered using battery 234 through the Kelvin connectors 124. Other connection mechanisms may also be employed such as, for example, a connection to the OBDII databus, a connection through a "cigarette lighter" of the vehicle, etc.

The tracking function discussed herein may also be used as a component of the testing function. For example, in order to ensure that all accessories are returned to their proper location, the system 100 can be configured to only provide a test result once all of the accessories are returned to their proper location within the base station 104. Batteries or storage systems within the various components can store power during the testing process in which power is received from the battery or the vehicle under test. Other charging techniques may also be employed such as, for example, through an electrical connection to the base station 104. The amp clamp 120 may also include additional electronic circuitry and input/output circuitry to perform tests of its own. For example, such circuitry can be used to provide an operator with information related to the amount of current being sensed during a particular operation of the vehicle. Other diagnostic functionality may also be implemented.

Figure 8:
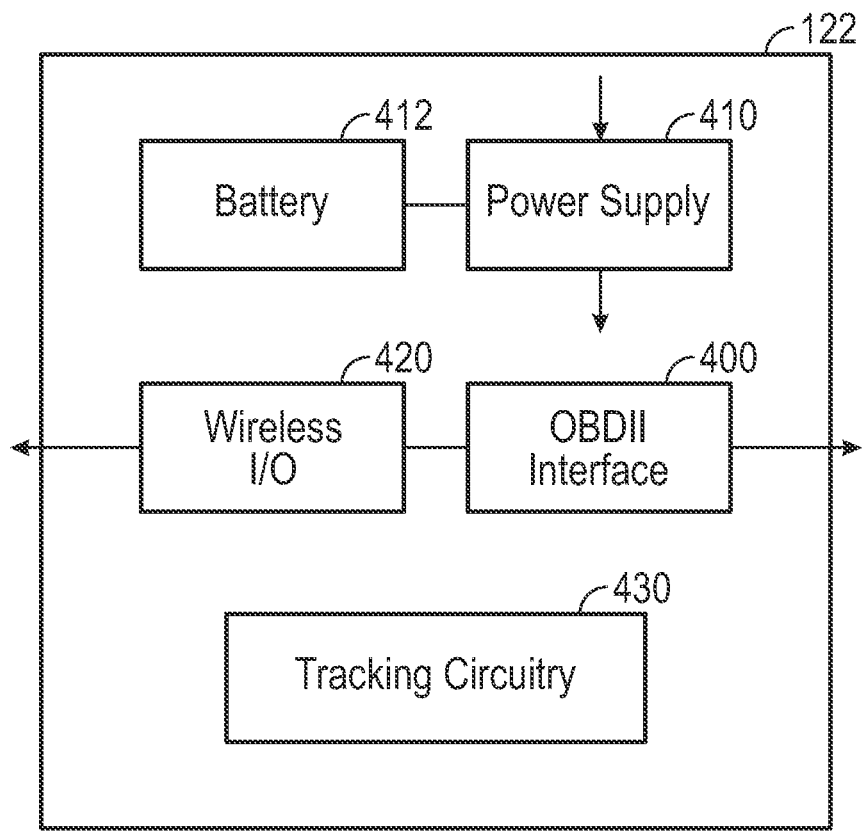
FIG. 8 is a simplified block diagram of an OBDII communicator of FIG. 1.

FIG. 8 is a simplified block diagram of the OBDII communicator 122 shown in FIG. 5. Communicator 122 includes an OBDII interface 400 for connection to an OBDII data port of an automotive vehicle. This allows a two-way communication with the databus of the vehicle. Although an OBDII interface is illustrated, interface 400 may communicate with any type of vehicle databus or the like. Communicator 122 includes a power supply 410 for use in providing power to the device. An internal battery 412 is used for powering the communicator 122. The battery of 412 may be charged, for example, when the communicator 122 is placed in the receiving area 110B shown in FIG. 5. Wireless communication circuitry 420 is provided for use in wirelessly communicating with the battery tester 102. The wireless communication circuitry 420 may also be used to communicate with base station 104. Using this communication circuitry 420, the devices can communicate with the onboard databus of a vehicle using the OBDII interface 400. Tracking circuitry 430 is also provided and may include a unique address at which identifies the communicator 122. Further, the tracking circuitry 430 may be used by base station 104 to identify positioning of the communicator 122 within the receiving area 110B.

Figure 9:
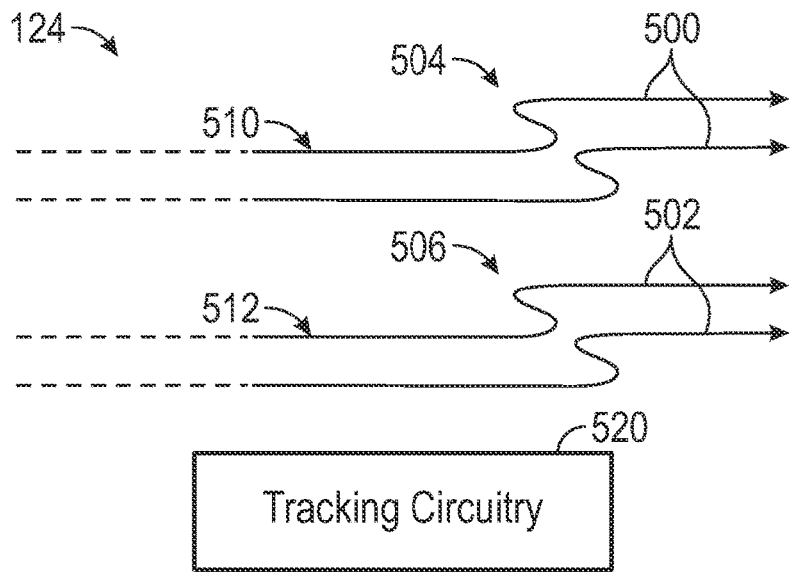
FIG. 9 is a diagram showing Kelvin connectors of FIG. 1.

FIG. 9 is a simplified diagram of Kelvin connectors 124 used to connect to battery 10. Kelvin connectors 124 include a pair of Kelvin connections 500, 502 each containing two electrical connections. Kelvin connections 500, 502 may be configured in alligator clamps 504, 506, respectively, or the like. Cabling 510, 512 is used to provide a physical electrical connection to the battery tester 102 shown in FIG. 5. Tracking circuitry 520 may include a unique address for use in identifying the Kelvin connector 124. This may also be used for determining placement of the Kelvin connector 124 into the receiving area 110D of the base station 104.

Figure 10:
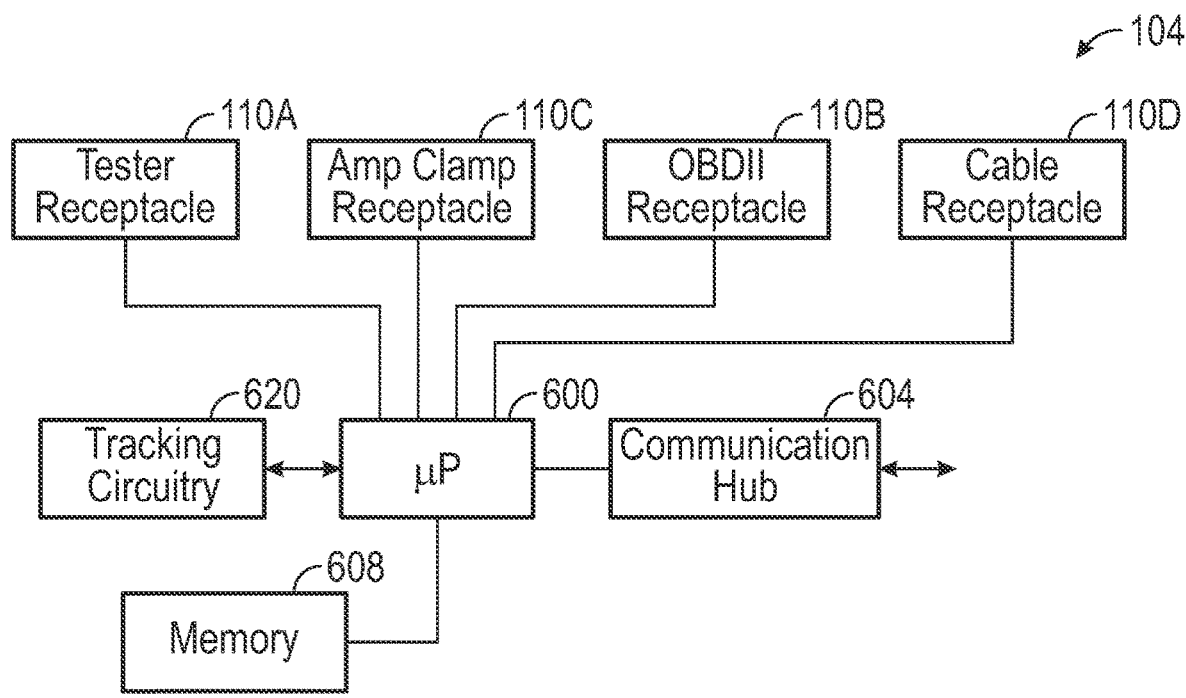
FIG. 10 is a simplified block diagram of a base station shown in FIG. 1.

FIG. 10 is a simplified block diagram of base station 104. Base station 104 includes a microprocessor 600 optionally connected to receptacles 110A-D. Using this optional connection, microprocessor 600 may use a physical connection to the tester 102, amp clamp 120, OBDII communicator 122 and Kelvin connectors 124 for communication. This may be for downloading parameters, programming the device, or for other usage. Microprocessor 600 also couples to a communication hub 604. Communication hub 604 provides both wireless and wired communication. For example, information can be communicated to a remote location including a data "cloud", using wireless or wired communication techniques including WiFi, cellular data transmission, hard wired Ethernet, Bluetooth®, etc. Communication hub 604 may also be used for wirelessly communicating with the various components of the system 100 including the battery tester 102, amp clamp 120, OBDII communicator 122 and Kelvin connectors 124. Optional user input/output may also be provided for the communication hub, for example, for displaying information or receiving a user input. Communication hub 604 may be used for communicating with a local device such as a printer as well as a portable user interface, for example, provided by a tablet computer, cellular phone, or other device including an application specific device. Microprocessor 600 is coupled to a memory 608 which is used to store programming instructions as well as store calibration parameters, etc. Further, test measurements or the like may be stored into the memory 608. Base station 104 includes a power supply 610 used for powering components of the base station 104. Power supply 610 may also be used for recharging batteries carried by the battery tester 102, amp clamp 120, OBDII communicator 122 and Kelvin connectors 124. An optional battery 612 is provided for powering the base station 104 when an external power source is not available.

Base station 104 includes tracking circuitry 620. Tracking circuitry 620 is used to communicate with the tracking circuits carried within the various accessories of the system 100. In a specific example, the tracking circuitry 620 communicates with the tracking circuit 240 of battery tester 102, the tracking circuit 430 of OBDII 122, the tracking circuit 520 of Kelvin connectors 124 for determining when they are placed within their receiving areas 110A-110D of base station 104. Further, the various components may wirelessly communicate with tester 102 and/or base station 104.

Figure 11:
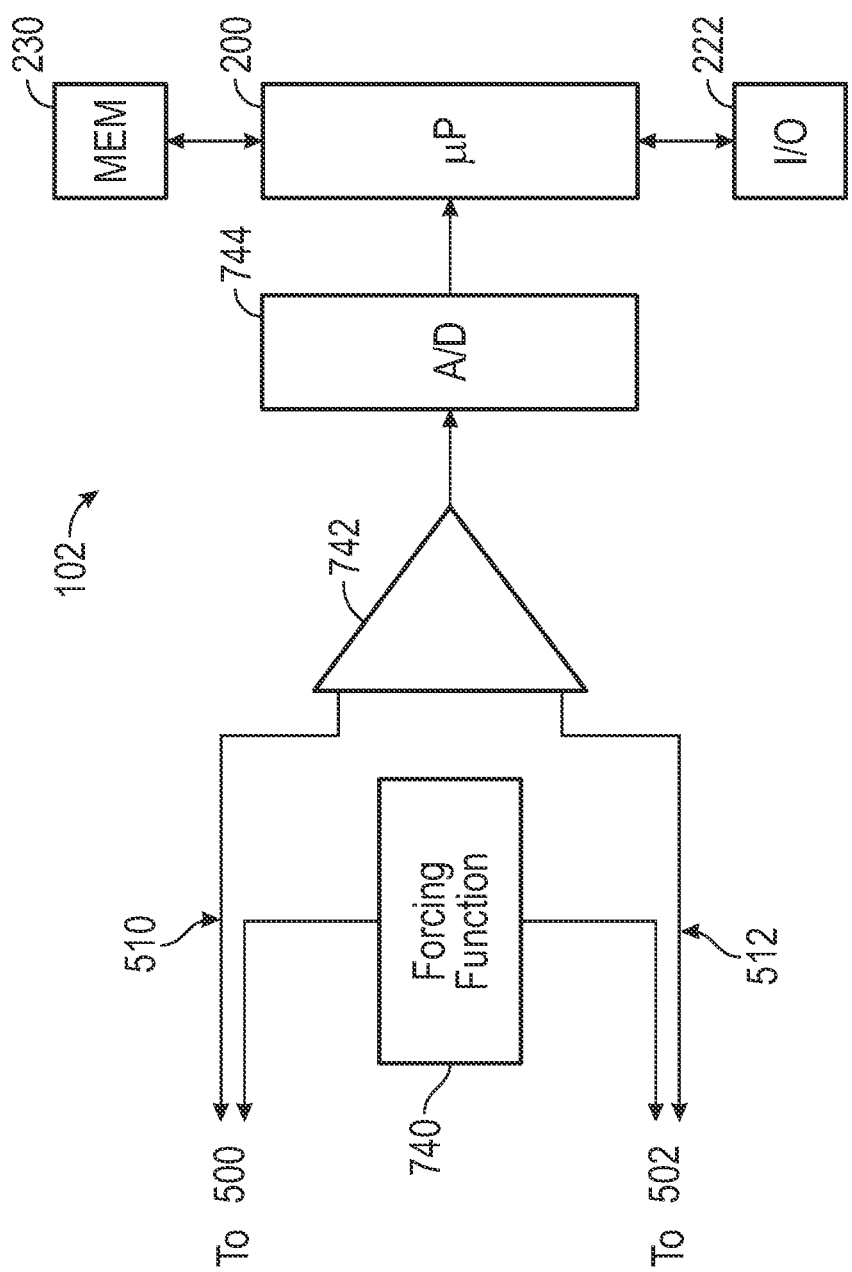
FIG. 11 is a simplified schematic diagram including measurement circuitry of the system of FIG. 1.

FIG. 11 is a more detailed block diagram of battery tester 102 which includes a forcing function 740 and an amplifier 742 coupled to connectors 500. In the illustration of FIG. 7, connectors 500 are shown as Kelvin connections. The forcing function 740 can be any type of signal which has a time varying component including a transient signal. The forcing function can be through application of a load or by applying an active signal to a battery. A response signal is sensed by amplifier 742 and provided to analog to digital converter 744 which couples to microprocessor 200. Microprocessor 200 operates in accordance with instructions stored in memory 230. Microprocessor 200 can store data into memory 230.

Of course, the illustration of FIG. 11 is simply one simplified embodiment and other embodiments are in accordance with the invention. In the illustrated embodiment microprocessor 200 is configured to measure a dynamic parameter based upon the forcing function 740. This dynamic parameter can be correlated with battery condition as set forth in the above-mentioned Champlin and Midtronics, Inc. patents. However, other types of battery tests circuitry can be used in the present invention and certain aspects of the invention should not be limited to the specific embodiment illustrated herein. FIG. 11 also illustrates an input/output circuitry 222 which can be any other type of input and/or output coupled to microprocessor 46. For example, this can be used to couple to external devices or to facilitate user input and/or output. Although a microprocessor 200 is shown, other types of computational or other circuitry can be used to collect and place data into memory 230. Further, in one configuration, the forcing function 740 can be configured as a large electrical load for performing a load test. In another example configuration, the forcing function 740 provides a battery charging function is which charge is applied to the storage battery and monitored to determine battery condition.

Figure 12:
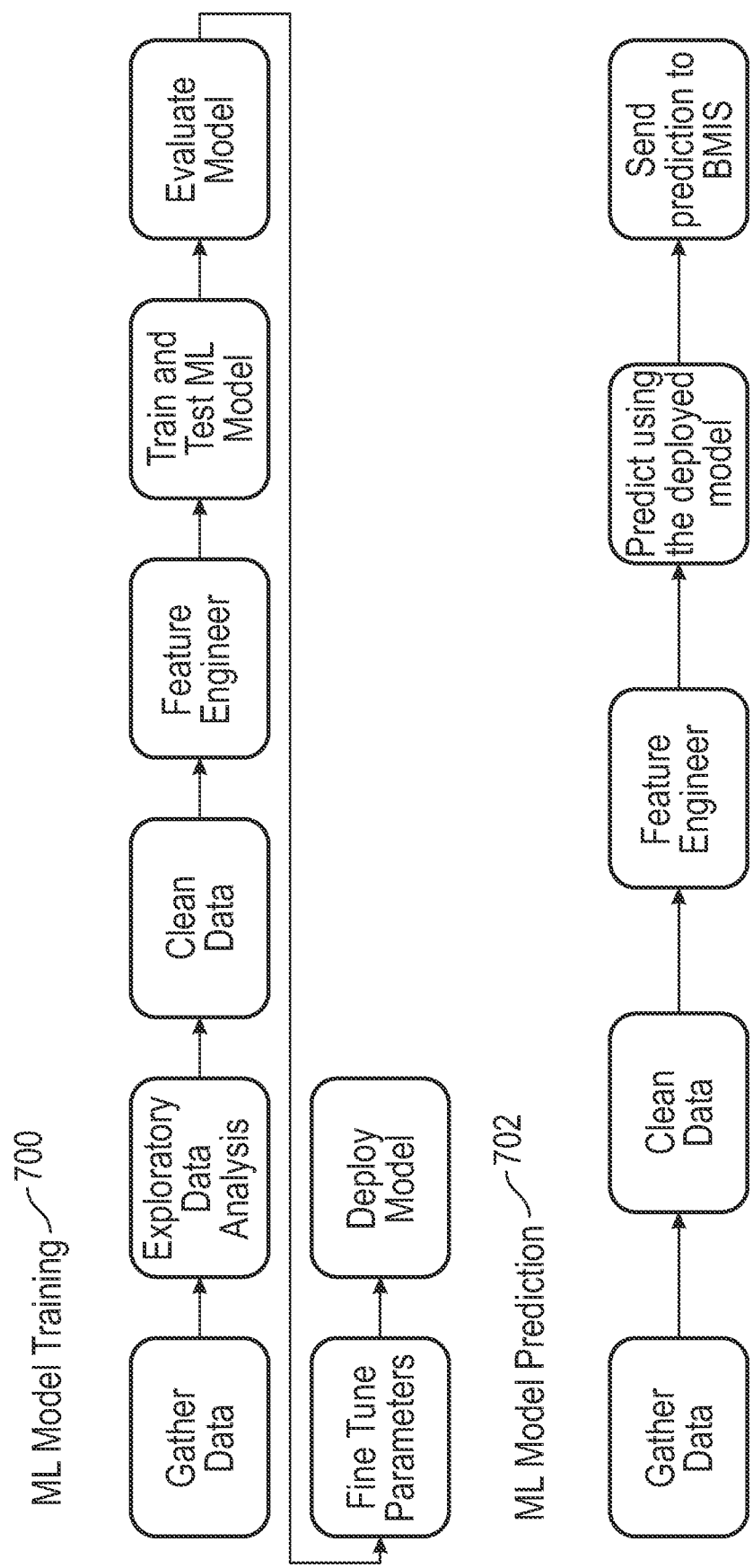
FIG. 12 is a simplified block diagram of a machine learning model training and a machine learning model prediction in accordance with a further embodiment of the invention.

Further, using the system set forth herein, a battery maintenance system which includes machine learning is provided. FIG. 12 is a simplified block diagram of a machine learning model training 700 and a machine learning model prediction 702 in accordance with a further embodiment of the invention. In such a configuration, the test equipment 100 set forth herein is configured to gather data such starter voltage profile information and battery condition information as shown in FIG. 4. The data then is analyzed and acted upon using machine learning techniques performed either locally, remotely, or in a hybrid fashion. As set forth in FIG. 12, the machine learning training mode includes gathering test data followed by exploratory data analysis. The collected data is cleaned if necessary to remove undesired data points. This cleaning function includes removing outlier data, data with excessive noise, etc. A feature engineer step is provided followed by a train and test machine learning model. The feature engineering step can be used to discard bad data. For example, an unusually cold temperature measurement obtained in a warm climate can be identified and discarded. Any appropriate feature engineering technique can be used. The machine learning can be through known neural network or other machine learning techniques. The model is then evaluated but collecting additional starter voltage profile and battery condition information and comparing the results from the model with actual measured battery conditions. Parameters are fine-tuned as desired. A model can then be deployed in service either locally at a test location, remotely at a cloud-based location for example, or in a hybrid combination of such locations.

Similarly, the system includes a machine learning model prediction phase 702 once the model is sufficiently trained and put into service. In this phase, data is gathered and cleaned along with processed through a feature engineer. The data is then used to predict a battery test result or other test result including an alternator test result. This prediction is then output as desired, for example this prediction can be output locally and/or transmitted to a remote location. The steps in accordance with the machine learning model training mode are set forth below in more detail:

- Connect tester clamps to battery and perform a battery test and starter test on a vehicle.
- Send the battery test and starter test measurement and result data to a test database.
- Record corresponding DCA (Dynamic Charge Acceptance) test if battery test result is charge and retest and technician charges the battery on a charger.
- Clean the data for bad data, missing data and outliers.
- Perform stratified sampling to ensure a good representation of all the decisions in the dataset are present.
- Simplify from multiple decision types to a binary decision type (Good battery, Bad battery).
- Transform information into a format that can be interpreted by the machine learning model:
  - Convert starter data from a single cell colon separated data to an array format with multiple readings per second.
  - Feature engineer data to obtain information about battery health, for example, using the array format above to calculate the average voltage of the starter test.
  - Transform additional data columns such as temperature to ensure they are in the consistent measurement unit.
- Divide this simplified and transformed data into two sets of training data and test data.
- Supply this training data to multiple Machine Learning algorithms for building the model.
- Apply the ML model to the test data to measure the accuracy and cross validation score.
- Evaluate the models for accuracy, sensitivity, specificity, cross validation and log loss.
- Fine tune model parameters.
- Deploy the model to production for real-time battery decision prediction.
- Retrain and redeploy the model with new data if the data distribution deviates significantly from the initial training set.

Similarly, once the machine learning model is deployed into service, a prediction model is implemented as follows:

- Connect tester clamps to battery and perform battery and starter test.
- Clean the measurement data for bad data, missing data and outliers. e.g., voltages above "x" volts or Temperatures above "y" Fahrenheit.
- Transform the data in a format that can be interpreted by the machine learning model.
  - Convert starter data from a single cell colon separated data to an array format with multiple readings per second.
  - Feature engineer the data e.g. using the array format above to calculate the average voltage of the starter test.
  - Additional data columns such as temperature are transformed to ensure they are in the same measurement unit.
- Supply transformed data to the machine learning model in production.
- Return the predicted battery result to the tester/charger and data cloud.

The particular machine learning can be implemented using standard computer programming techniques which are known in the art such as neural networking techniques. The techniques can be used to test automotive vehicle batteries (including electric and hybrid vehicles), backup power supply batteries, etc., as well as components of automotive vehicles such as starter motors.

In one specific configuration, voltage is measured at a rate of 1000 samples per second. Any number of data points can be collected. In one embodiment, 513 data points are collected. If a training dataset is imbalanced, for example, having disproportionately high number of "good" battery tests compared to "bad" battery tests, the data can be balanced using known techniques. For example, stratified sampling can be used, SMOTE (Synthetic Minority Oversampling Technique) can be used, or others. Further, outlying data in standard deviations, mean and median voltage value, or other parameters can be discarded from the training model. Once a model is trained for example, using the XGBoost method, the model parameters such as Tree depth, minimum child weight, learning rate, etc., can be fine tuned.

Although the present invention has been described with reference to preferred embodiments, workers skilled in the art will recognize that changes may be made in form and detail without departing from the spirit and scope of the invention. The devices described herein, in some embodiments, may be capable of wireless communication. The particular wireless communication technique may be implemented as desired. Examples include Bluetooth® communication techniques, near field communication techniques, WiFi communication techniques, cellular communication techniques or others. The test performed by the battery tester 102 may be a function of information input by a user, or information received from other sources, such as the VIN of the vehicle. The VIN information may be obtained using a barcode scanner or through the connection to the OBDII databus. Based upon a particular vehicle, the battery test can be adjusted accordingly. The amp clamp 120 may be used in conjunction with the battery test, or may be used for performing other tests on the vehicle. Such tests include measuring starter current, phantom current draws, charging current, etc. The testing and measurements circuits and components, along with memory and logic functionality, discussed herein can be implements in shared components and need not be discrete components. For example, the same voltage sensor used to measure a dynamic parameter can be used to collect starter voltage profile information. The memories and logic functionalities illustrated and discussed herein can be implemented locally, remotely, or a combination of local and remote implementations. Although the starter voltage profile is described herein as voltage data, current data may also be used as the two parameters are related. For example, current flowing from the battery while the starter motor is engaged is related to a voltage drop across a series resistance, a voltage output from an amp clamp, etc. In one aspect, the machine learning model eliminates the need to charge the battery and retest the battery, thus reducing the required to complete a battery test.

What is claimed is:

1. An electronic battery tester for testing a storage battery in an automotive vehicle, comprising:
    first test circuitry configured to couple to the storage battery, apply a forcing function to the storage battery, measure a response of the storage battery to the applied forcing function and provide a battery test output related to a condition of the battery based upon the response of the battery to the applied forcing function;
    starter voltage measurement circuitry configured to electrically couple to a starter motor of the automotive vehicle and collect starter voltage profile information comprising a plurality of starter voltage measurements obtained at different times while operating the starter motor; and
    second test circuitry configured to receive the battery test output from the first test circuitry and the starter voltage profile information and provide an enhanced battery test output related to the condition of the battery based upon the battery test output and the starter voltage profile information.

2. The electronic battery tester of claim 1 wherein the starter voltage measurements comprise a voltage across a storage battery of the automotive vehicle.

3. The electronic battery tester of claim 1 including a connection to a databus of the vehicle.

4. The electronic battery tester of claim 3 wherein the starter voltage measurements are obtained through the databus of the vehicle.

5. The electronic battery tester of claim 1 including an output to prompt an operator to engage the starter motor of the vehicle.

6. The electronic battery tester of claim 1 wherein the voltage measurements are obtained at fixed time intervals.

7. The electronic battery tester of claim 1 wherein the voltage measurements are obtained at variable time intervals.

8. The electronic battery tester of claim 1 including a memory configured to store the starter voltage measurements.

9. The electronic battery tester of claim 1 wherein the starter voltage measurements are used to determine a condition of the storage battery.

10. The electronic battery tester of claim 9 wherein the condition of the storage battery determines using the first test circuitry and the condition of the storage battery using the starter voltage measurement circuitry are compared for verification.

11. The electronic battery tester of claim 1 wherein the starter voltage measurements include a measurement obtained before the starter motor is engaged and a measurement obtained while the starter motor is engaged.

12. The electronic battery tester of claim 1 wherein the starter voltage profile information is compared with stored starter voltage profile information to determine a condition of the storage battery.

13. The electronic battery tester of claim 1 including a memory configured to store a plurality of starter voltage profile measurements.

14. The electronic battery tester of claim 13 wherein the plurality of stored starter voltage profile measurements are associated with a condition of the storage battery.

15. The electronic battery tester of claim 1 wherein the condition of the battery is further determined based upon a temperature.

16. The electronic battery tester of claim 1 wherein the condition of the battery is determined using the starter voltage profile information and machine learning implanted by the second test circuitry.

17. The electronic battery tester of claim 1 wherein the enhanced battery test output is a function of a slope in the starter voltage profile information.

18. The electronic battery tester of claim 1 wherein the second test circuitry monitors noise present in the starter voltage profile information.

19. The electronic battery tester of claim 1 wherein if the battery test output from the first test circuitry indicates a good condition of the storage battery and the starter voltage profile information shows an unusually large voltage drop, the enhanced battery test output comprises a bad battery determination.

20. The electronic battery tester of claim 1 wherein the enhanced battery test output is further a function of current measurements.

21. The electronic battery tester of claim 1 wherein the second test circuitry discards starter voltage measurements which are determined to be bad data.

22. The electronic battery tester of claim 1 including communication circuitry to communicate the starter voltage profile information to a remote location for training of machine learning.

* * * * *